US008738986B2

(12) United States Patent
Srinivas et al.

(10) Patent No.: US 8,738,986 B2
(45) Date of Patent: May 27, 2014

(54) REMOTE PRESENTATION OVER LOSSY TRANSPORT WITH FORWARD ERROR CORRECTION

(75) Inventors: Nelamangal Krishnaswamy Srinivas, Sammamish, WA (US); Nadim Y. Abdo, Bellevue, WA (US); Sanjeev Mehrotra, Kirkland, WA (US); Tong L. Wynn, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 788 days.

(21) Appl. No.: 12/718,537

(22) Filed: Mar. 5, 2010

(65) Prior Publication Data

US 2011/0219287 A1  Sep. 8, 2011

(51) Int. Cl.
*H03M 13/00* (2006.01)

(52) U.S. Cl.
USPC .......................................... 714/752; 714/786

(58) Field of Classification Search
USPC .................. 370/389, 473; 709/231; 455/434; 714/786, 57, 776, 787, 752
See application file for complete search history.

(56) References Cited

U.S. PATENT DOCUMENTS

| 5,699,369 | A | 12/1997 | Guha |
| 6,421,387 | B1 | 7/2002 | Rhee |
| 6,574,668 | B1 | 6/2003 | Gubbi et al. |
| 7,149,664 | B1 | 12/2006 | Firoiu et al. |
| 7,336,611 | B1 | 2/2008 | Aweya et al. |
| 7,372,814 | B1 | 5/2008 | Chiruvolu et al. |
| 7,447,148 | B2 | 11/2008 | Gao et al. |
| 7,512,066 | B2 | 3/2009 | Santos et al. |
| 7,958,435 | B2 * | 6/2011 | Kure et al. ............... 714/776 |
| 8,085,767 | B2 * | 12/2011 | Lussier et al. ........... 370/389 |
| 8,122,140 | B2 * | 2/2012 | Barreto et al. ........... 709/231 |
| 8,122,330 | B2 * | 2/2012 | De Lind Van Wijngaarden et al. ............... 714/787 |
| 8,156,235 | B2 * | 4/2012 | Barreto et al. ........... 709/231 |
| 8,209,430 | B2 * | 6/2012 | Barreto et al. ........... 709/231 |
| 8,265,624 | B2 * | 9/2012 | Guner et al. ............. 455/434 |
| 8,553,540 | B2 | 10/2013 | Mehrotra et al. |
| 2005/0025052 | A1 | 2/2005 | Zhao et al. |
| 2005/0068894 | A1 | 3/2005 | Yu et al. |
| 2005/0144303 | A1 | 6/2005 | Zhang et al. |
| 2006/0015639 | A1 | 1/2006 | Taylor |
| 2009/0006920 | A1 | 1/2009 | Munson et al. |
| 2009/0092152 | A1 * | 4/2009 | Rajakarunanayake et al. ............... 370/473 |
| 2009/0177793 | A1 | 7/2009 | Josa et al. |
| 2011/0216648 | A1 | 9/2011 | Mehrotra et al. |
| 2013/0279338 | A1 | 10/2013 | Mehrotra et al. |

OTHER PUBLICATIONS

Habib et al., "Taking Advantage of Multihoming with Session Layer Striping," Apr. 29, 2006, 6 pgs, downloaded Jan. 7, 2010, http://citeseerx.ist.psu.edu/viewdoc/download?doi=10.1.1.65.2543&rep=rep1&type=pdf.

(Continued)

*Primary Examiner* — David Ton
(74) *Attorney, Agent, or Firm* — Merchant & Gould P.C.

(57) ABSTRACT

In various embodiments, methods and systems are disclosed for integrating a remote presentation protocol with a datagram based transport. In one embodiment, an integrated protocol is configured to support lossless or reduced loss transport based on Retransmission (ARQ) combined with Forward Error Correction (FEC). The protocol involves encoding and decoding of data packets including feedback headers and FEC packets, continuous measurement of RTT, RTO and packet delay, dynamically evaluating loss probability to determine and adjust the ratio of FEC, congestion management based on dynamically detecting increase in packet delay, and fast data transmission rate ramp-up based on detecting a decrease in packet delay.

20 Claims, 15 Drawing Sheets

(56) References Cited

OTHER PUBLICATIONS

Amir et al., "A Low Latency, Loss Tolerant Architecture and Protocol for Wide Area Group Communication," 2000, 10 pgs, downloaded Jan. 7, 2010, http://reference.kfupm.edu.sa/content/l/o/a_low_latency_loss_tolerant_architectur_127723.pdf.

Rubenstein et al., "Real-Time Reliable Multicast Using Proactive Forward Error," 1998, 32 pgs, downloaded Jan. 7, 2010, http://citeseerx.ist.psu.edu/viewdoc/summary?doi=10.1.1.42.8519.

"Hybrid Window and Rate Based Congestion Control for Delay Sensitive Applications", Paper ID 1729, ICME, 2010, 6 pages.

Brakmo et al., "TCP Vegas: New Techniques for Congestion Detection and Avoidance", ACM SIGCOMM Computer Communication Review, Oct. 1994, 24(4), 12 pages.

Chiu et al., "Analysis of the Increase/Decrease Algorithms for Congestion Avoidance in Computer Networks", Computer Networks and ISDN Systems, Jun. 10, 1989, 17(1), 1-14.

Choi et al., "Designing TCP-friendly Window-based Congestion Control for Real-time Multimedia Applications", May 2009, 6 pages.

Floyd et al., "The NewReno Modification to TCP's Fast Recovery Algorithm", IETF, Nov. 2003, 1-4.

Jain, "End-to-end available Bandwidth: Measurement Methodology, Dynamics, and Relation with TCP Throughput", Constantinos Dovrolis, 2002, 1-22.

Jin et al., "FAST TCP: Motivation, Architecture, Algorithms, Performance", IEEE/ACM Transactions on Networking, Dec. 2006, 14(6), 12 pages.

Kelly et al., "Rate Control for Communication Networks: Shadow Prices, Proportional Fairness, and Stability", Proceedings of the 6th ACM international symposium on Mobile ad hoc networking and computing, Mar. 1998, 49(3), 3 pages.

Liu et al., "TCP-Illinois: A Loss and Delay-based Congestion Control Algorithm for High-speed Networks", Performance Evaluation, Jun. 2008, 65(6-7), 13 pages.

Pathmasuntharam et al., "A Flow Control Framework for Improving Throughput and Energy Efficiency in CSMA/CA based Wireless Multihop Networks", IEEE, Proceedings of the 2006 International Symposium on a World of Wireless, Mobile and Multimedia Networks (WoWMoM'06), Buffalo, New York, Jun. 26-29, 2006, 7 pages.

Santos et al., "End-to-end Congestion Control for System Area Networks", Internet Systems and Storage Laboratory, HP Laboratories Palo Alto, May 13, 2002, 25 pages.

Tan et al., "A Compound TCP Approach for High-speed and Long Distance Networks", 25th IEEE International Conference on Computer Communications, Barcelona, Spain, Apr. 2006, 12 pages.

Turner et al., "An Approach for Congestion Control in Infiniband", Internet Systems and Storage Laboratory, HP Laboratories Palo Alto, May 14, 2002, 19 pages.

* cited by examiner

REMOTE PRESENTATION OVER LOSSY TRANSPORT WITH FORWARD ERROR CORRECTION

BACKGROUND

Remote computing systems can enable users to remotely access hosted resources. Servers on the remote computing systems can execute programs and transmit signals indicative of a user interface to clients that can connect by sending signals over a network conforming to a communication protocol such as the TCP/IP protocol. Each connecting client may be provided a remote presentation session, i.e., an execution environment that includes a set of resources. Each client can transmit signals indicative of user input to the server and the server can apply the user input to the appropriate session. The clients may use remote presentation protocols such as the Remote Desktop Protocol (RDP) to connect to a server resource.

Remote presentation protocols are typically session level protocols that use a TCP-type connection between the client and the host. When a remote presentation session is established over a wide area network, round trip time and data packet loss may result in delays that negatively impact real time end user experience, such as tearing and jitter.

SUMMARY

In various embodiments, methods and systems are disclosed for integrating the remote presentation protocol with a datagram based transport.

In one embodiment, such an integrated protocol may be configured to support lossless or reduced loss transport based on Retransmission (ARQ) combined with Forward Error Correction (FEC). The protocol includes encoding and decoding of data packets including feedback headers and FEC packets, continuous measurement of RTT, RTO and packet delay, dynamically evaluating a loss probability to determine and adjust the FEC ratio, congestion management based on dynamically detecting an increase in packet delay, and fast data transmission rate ramp-up based on detecting a decrease in packet delay. In an embodiment, the transport layer may be integrated into both the server and client, and may provide the ability to provide a lossless transport with in-order data delivery or a lossy transport and report back data loss or out-of-order delivery to the remote presentation layer. The integrated protocol may implement a remote presentation session over a single transport, or co-exist with TCP based transport for different portions of the data stream.

BRIEF DESCRIPTION OF THE DRAWINGS

The systems, methods, and computer readable media for using a datagram based transport protocol to transmit remote presentation data in accordance with this specification are further described with reference to the accompanying drawings in which.

DETAILED DESCRIPTION

Computing Environments in General Terms

Certain specific details are set forth in the following description and figures to provide a thorough understanding of various embodiments of the disclosure. Certain well-known details often associated with computing and software technology are not set forth in the following disclosure to avoid unnecessarily obscuring the various embodiments of the disclosure. Further, those of ordinary skill in the relevant art will understand that they can practice other embodiments of the disclosure without one or more of the details described below. Finally, while various methods are described with reference to steps and sequences in the following disclosure, the description as such is for providing a clear implementation of embodiments of the disclosure, and the steps and sequences of steps should not be taken as required to practice this disclosure.

Figure 1:
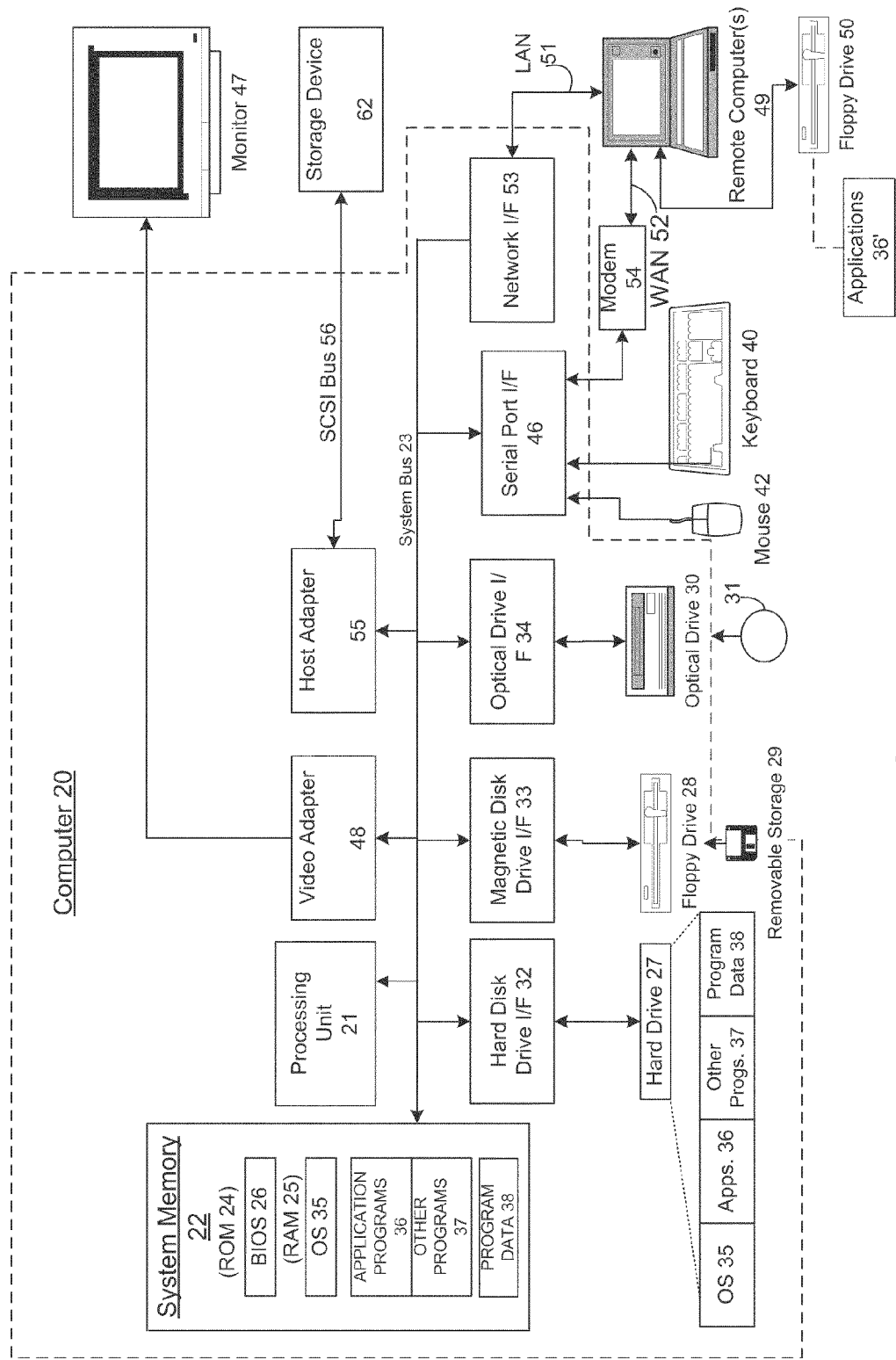
FIGS. 1 and 2 depict an example computer system wherein aspects of the present disclosure can be implemented.
Figure 2:
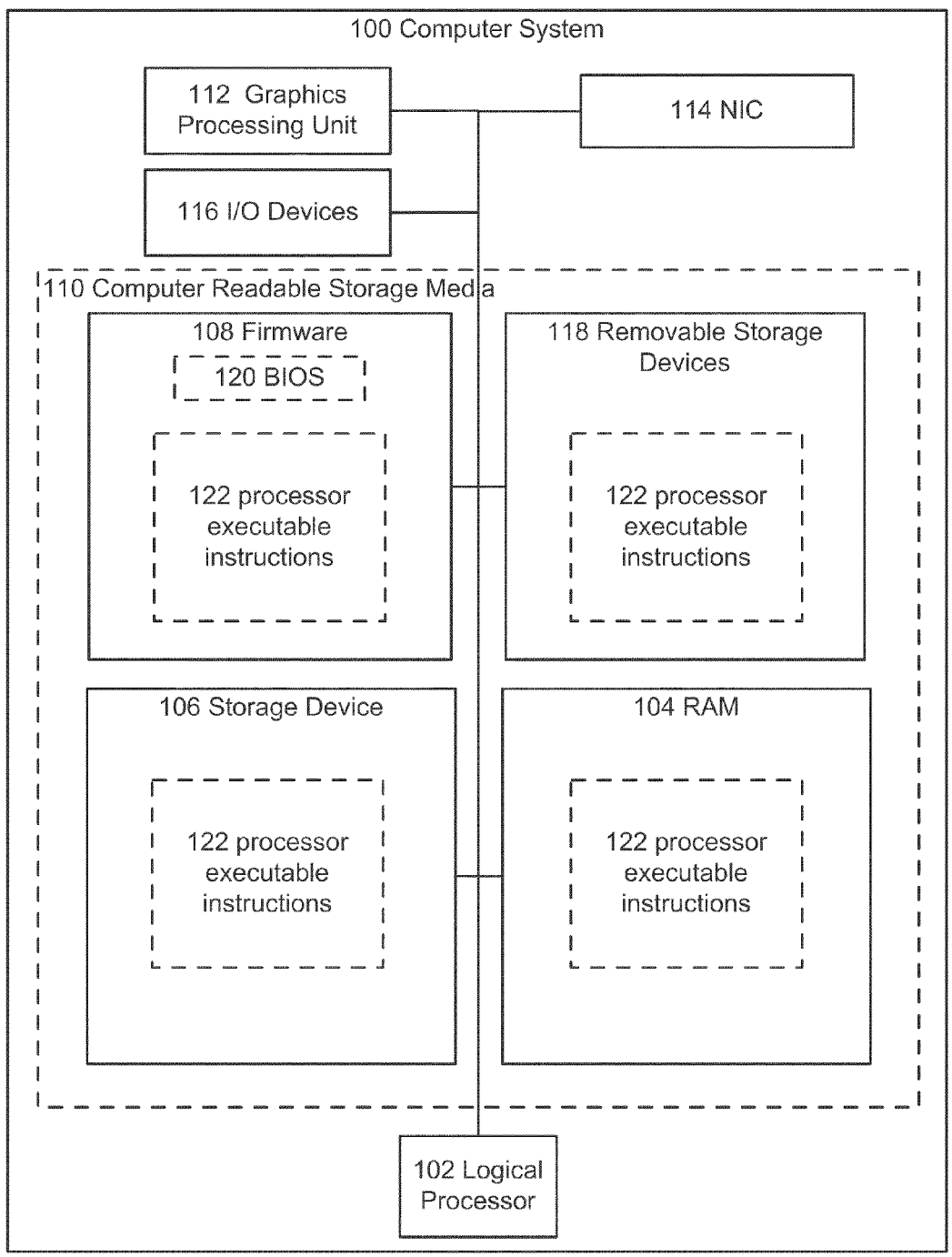

Embodiments may execute on one or more computers. FIGS. 1 and 2 and the following discussion are intended to provide a brief general description of a suitable computing environment in which the disclosure may be implemented. One skilled in the art can appreciate that computer systems 200, 300 can have some or all of the components described with respect to computer 100 of FIGS. 1 and 2.

The term circuitry used throughout the disclosure can include hardware components such as hardware interrupt controllers, hard drives, network adaptors, graphics processors, hardware based video/audio codecs, and the firmware/software used to operate such hardware. The term circuitry can also include microprocessors configured to perform function(s) by firmware or by switches set in a certain way or one or more logical processors, e.g., one or more cores of a multi-core general processing unit. The logical processor(s) in this example can be configured by software instructions embodying logic operable to perform function(s) that are loaded from memory, e.g., RAM, ROM, firmware, and/or virtual memory. In example embodiments where circuitry includes a combination of hardware and software an implementer may write source code embodying logic that is subsequently compiled into machine readable code that can be executed by a logical processor. Since one skilled in the art can appreciate that the state of the art has evolved to a point where there is little difference between hardware, software, or a combination of hardware/software, the selection of hardware versus software to effectuate functions is merely a design choice. Thus, since one of skill in the art can appreciate that a software process can be transformed into an equivalent hardware structure, and a hardware structure can itself be transformed into an equivalent software process, the selection of a hardware implementation versus a software implementation is trivial and left to an implementer.

FIG. 1 depicts an example of a computing system which is configured to with aspects of the disclosure. The computing system can include a computer 20 or the like, including a processing unit 21, a system memory 22, and a system bus 23 that couples various system components including the system memory to the processing unit 21. The system bus 23 may be any of several types of bus structures including a memory bus or memory controller, a peripheral bus, and a local bus using any of a variety of bus architectures. The system memory includes read only memory (ROM) 24 and random access memory (RAM) 25. A basic input/output system 26 (BIOS), containing the basic routines that help to transfer information between elements within the computer 20, such as during start up, is stored in ROM 24. The computer 20 may further include a hard disk drive 27 for reading from and writing to a hard disk, not shown, a magnetic disk drive 28 for reading from or writing to a removable magnetic disk 29, and an optical disk drive 30 for reading from or writing to a removable optical disk 31 such as a CD ROM or other optical media. In some example embodiments, computer executable instructions embodying aspects of the disclosure may be stored in ROM 24, hard disk (not shown), RAM 25, removable magnetic disk 29, optical disk 31, and/or a cache of processing unit 21. The hard disk drive 27, magnetic disk drive 28, and optical disk drive 30 are connected to the system bus 23 by a hard disk drive interface 32, a magnetic disk drive interface 33, and an optical drive interface 34, respectively. The drives and their associated computer readable media provide non volatile storage of computer readable instructions, data structures, program modules and other data for the computer 20. Although the environment described herein employs a hard disk, a removable magnetic disk 29 and a removable optical disk 31, it should be appreciated by those skilled in the art that other types of computer readable media which can store data that is accessible by a computer, such as magnetic cassettes, flash memory cards, digital video disks, Bernoulli cartridges, random access memories (RAMs), read only memories (ROMs) and the like may also be used in the operating environment.

A number of program modules may be stored on the hard disk, magnetic disk 29, optical disk 31, ROM 24 or RAM 25, including an operating system 35, one or more application programs 36, other program modules 37 and program data 38. A user may enter commands and information into the computer 20 through input devices such as a keyboard 40 and pointing device 42. Other input devices (not shown) may include a microphone, joystick, game pad, satellite disk, scanner or the like. These and other input devices are often connected to the processing unit 21 through a serial port interface 46 that is coupled to the system bus, but may be connected by other interfaces, such as a parallel port, game port or universal serial bus (USB). A display 47 or other type of display device can also be connected to the system bus 23 via an interface, such as a video adapter 48. In addition to the display 47, computers typically include other peripheral output devices (not shown), such as speakers and printers. The system of FIG. 1 also includes a host adapter 55, Small Computer System Interface (SCSI) bus 56, and an external storage device 62 connected to the SCSI bus 56.

The computer 20 may operate in a networked environment using logical connections to one or more remote computers, such as a remote computer 49. The remote computer 49 may be another computer, a server, a router, a network PC, a peer device or other common network node, a virtual machine, and typically can include many or all of the elements described above relative to the computer 20, although only a memory storage device 50 has been illustrated in FIG. 1. The logical connections depicted in FIG. 1 can include a local area network (LAN) 51 and a wide area network (WAN) 52. Such networking environments are commonplace in offices, enterprise wide computer networks, intranets and the Internet.

When used in a LAN networking environment, the computer 20 can be connected to the LAN 51 through a network interface or adapter 53. When used in a WAN networking environment, the computer 20 can typically include a modem 54 or other means for establishing communications over the wide area network 52, such as the Internet. The modem 54, which may be internal or external, can be connected to the system bus 23 via the serial port interface 46. In a networked environment, program modules depicted relative to the computer 20, or portions thereof, may be stored in the remote memory storage device. It will be appreciated that the network connections shown are examples and other means of establishing a communications link between the computers may be used. Moreover, while it is envisioned that numerous embodiments of the disclosure are particularly well-suited for computer systems, nothing in this document is intended to limit the disclosure to such embodiments.

Referring now to FIG. 2, another embodiment of an exemplary computing system 100 is depicted. Computer system 100 can include a logical processor 102, e.g., an execution core. While one logical processor 102 is illustrated, in other embodiments computer system 100 may have multiple logical processors, e.g., multiple execution cores per processor substrate and/or multiple processor substrates that could each have multiple execution cores. As shown by the figure, various computer readable storage media 110 can be interconnected by one or more system busses which couples various system components to the logical processor 102. The system buses may be any of several types of bus structures including a memory bus or memory controller, a peripheral bus, and a local bus using any of a variety of bus architectures. In example embodiments the computer readable storage media 110 can include for example, random access memory (RAM) 104, storage device 106, e.g., electromechanical hard drive, solid state hard drive, etc., firmware 108, e.g., FLASH RAM or ROM, and removable storage devices 118 such as, for example, CD-ROMs, floppy disks, DVDs, FLASH drives, external storage devices, etc. It should be appreciated by those skilled in the art that other types of computer readable storage media can be used such as magnetic cassettes, flash memory cards, digital video disks, and Bernoulli cartridges.

The computer readable storage media provide non-volatile storage of processor executable instructions 122, data structures, program modules and other data for the computer 100. A basic input/output system (BIOS) 120, containing the basic routines that help to transfer information between elements within the computer system 100, such as during start up, can be stored in firmware 108. A number of programs may be stored on firmware 108, storage device 106, RAM 104, and/or removable storage devices 118, and executed by logical processor 102 including an operating system and/or application programs.

Commands and information may be received by computer 100 through input devices 116 which can include, but are not limited to, a keyboard and pointing device. Other input devices may include a microphone, joystick, game pad, scanner or the like. These and other input devices are often connected to the logical processor 102 through a serial port interface that is coupled to the system bus, but may be connected by other interfaces, such as a parallel port, game port or universal serial bus (USB). A display or other type of display device can also be connected to the system bus via an interface, such as a video adapter which can be part of, or connected to, a graphics processor 112. In addition to the display, computers typically include other peripheral output devices (not shown), such as speakers and printers. The exemplary system of FIG. 1 can also include a host adapter, Small Computer System Interface (SCSI) bus, and an external storage device connected to the SCSI bus.

Computer system 100 may operate in a networked environment using logical connections to one or more remote computers, such as a remote computer. The remote computer may be another computer, a server, a router, a network PC, a peer device or other common network node, and typically can include many or all of the elements described above relative to computer system 100.

When used in a LAN or WAN networking environment, computer system 100 can be connected to the LAN or WAN through a network interface card 114. The NIC 114, which may be internal or external, can be connected to the system bus. In a networked environment, program modules depicted relative to the computer system 100, or portions thereof, may be stored in the remote memory storage device. It will be appreciated that the network connections described here are exemplary and other means of establishing a communications link between the computers may be used. Moreover, while it is envisioned that numerous embodiments of the present disclosure are particularly well-suited for computerized systems, nothing in this document is intended to limit the disclosure to such embodiments.

A remote desktop system is a computer system that maintains applications that can be remotely executed by client computer systems. Input is entered at a client computer system and transferred over a network (e.g., using protocols based on the International Telecommunications Union (ITU) T.120 family of protocols such as Remote Desktop Protocol (RDP)) to an application on a terminal server. The application processes the input as if the input were entered at the terminal server. The application generates output in response to the received input and the output is transferred over the network to the client computer system. The client computer system presents the output data. Thus, input is received and output presented at the client computer system, while processing actually occurs at the terminal server. A session can include a shell and a user interface such as a desktop, the subsystems that track mouse movement within the desktop, the subsystems that translate a mouse click on an icon into commands that effectuate an instance of a program, etc. In another example embodiment the session can include an application. In this example while an application is rendered, a desktop environment may still be generated and hidden from the user. It should be understood that the foregoing discussion is exemplary and that the presently disclosed subject matter may be implemented in various client/server environments and not limited to a particular terminal services product.

In most, if not all remote desktop environments, input data (entered at a client computer system) typically includes mouse and keyboard data representing commands to an application and output data (generated by an application at the terminal server) typically includes video data for display on a video output device. Many remote desktop environments also include functionality that extend to transfer other types of data.

Communications channels can be used to extend the RDP protocol by allowing plug-ins to transfer data over an RDP connection. Many such extensions exist. Features such as printer redirection, clipboard redirection, port redirection, etc., use communications channel technology. Thus, in addition to input and output data, there may be many communications channels that need to transfer data. Accordingly, there may be occasional requests to transfer output data and one or more channel requests to transfer other data contending for available network bandwidth.

Figure 3:
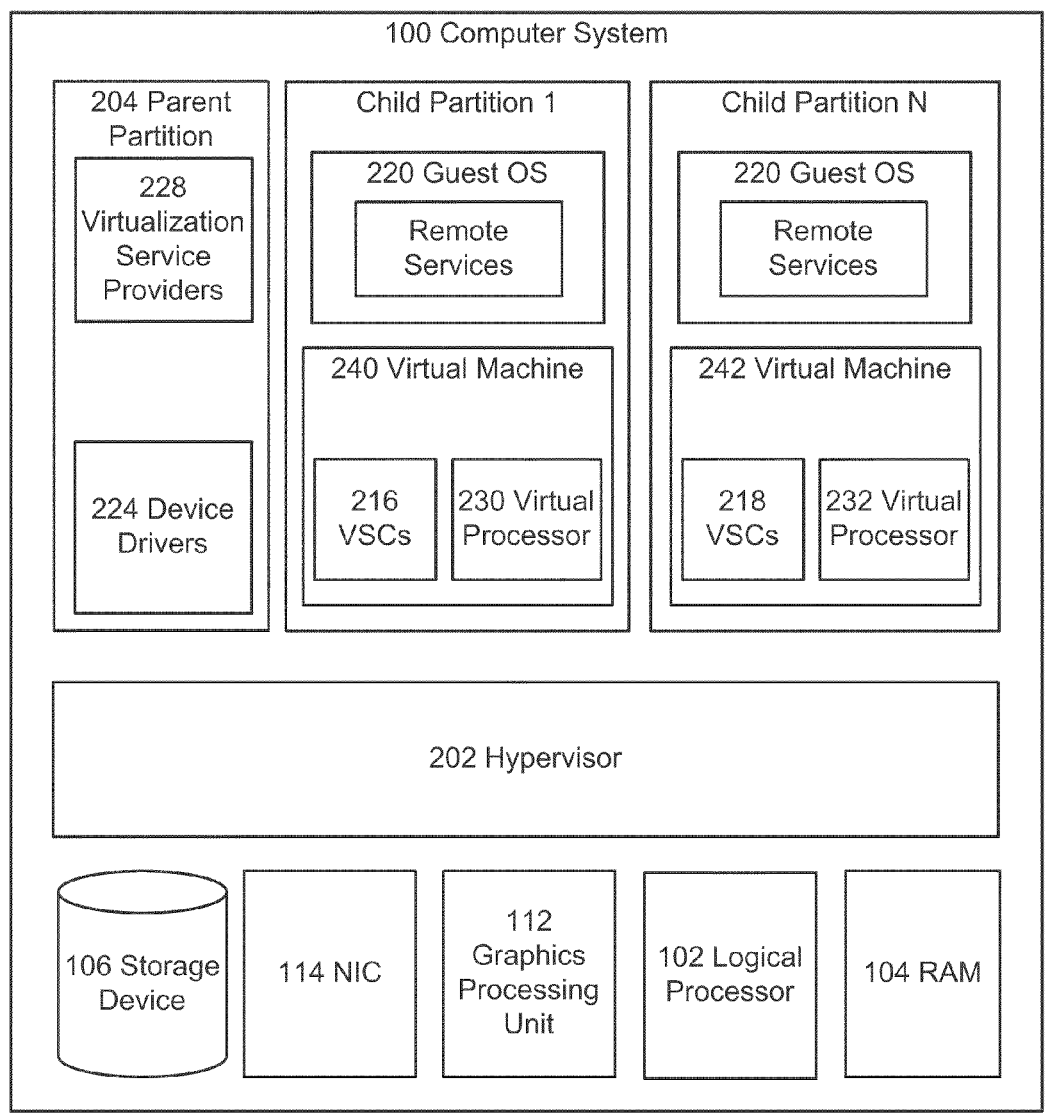
FIG. 3 depicts an operational environment for practicing aspects of the present disclosure.
Figure 4:
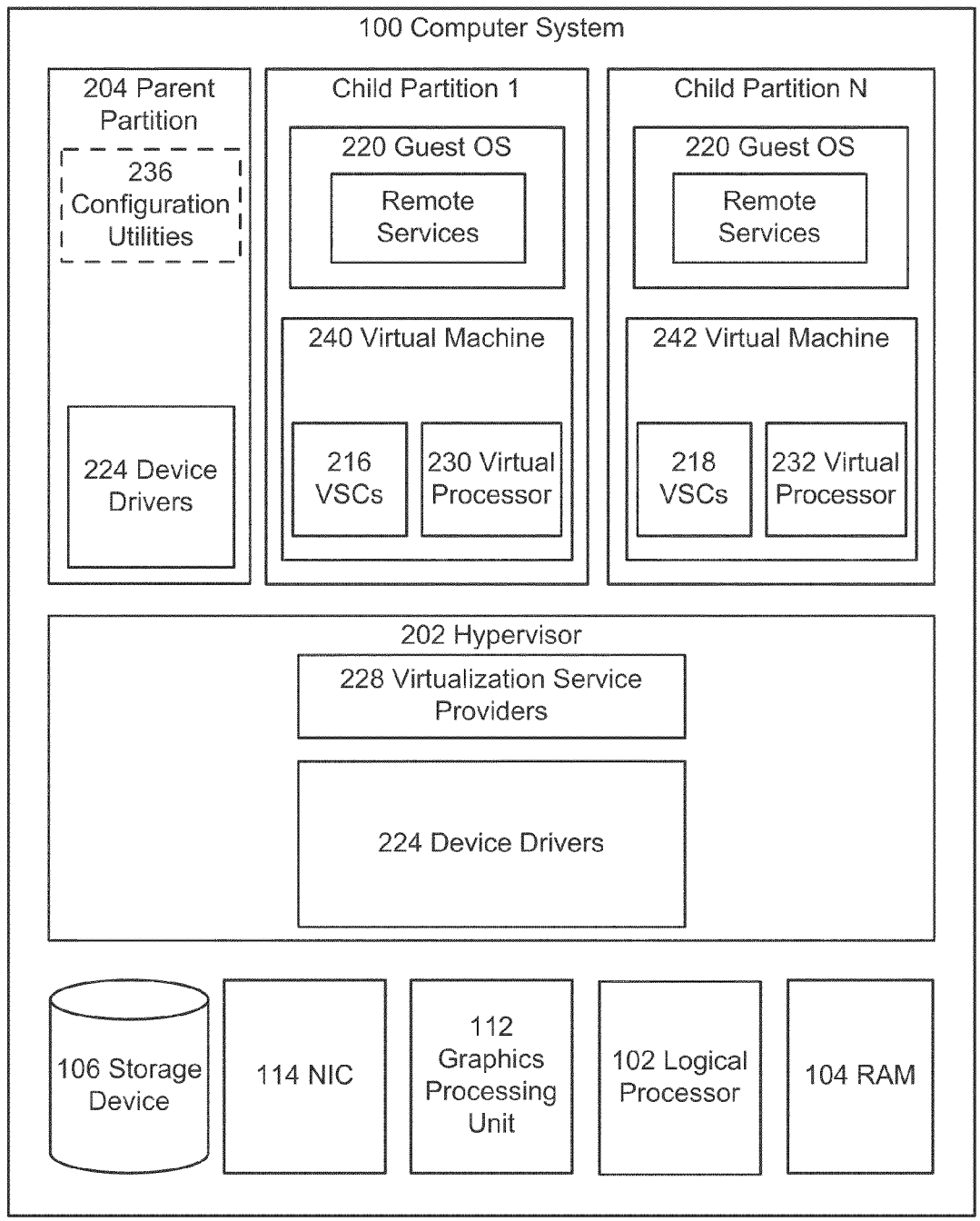
FIG. 4 depicts an operational environment for practicing aspects of the present disclosure.

Referring now to FIGS. 3 and 4, depicted are high level block diagrams of computer systems configured to effectuate virtual machines. As shown in the figures, computer system 100 can include elements described in FIGS. 1 and 2 and components operable to effectuate virtual machines. One such component is a hypervisor 202 that may also be referred to in the art as a virtual machine monitor. The hypervisor 202 in the depicted embodiment can be configured to control and arbitrate access to the hardware of computer system 100. Broadly stated, the hypervisor 202 can generate execution environments called partitions such as child partition 1 through child partition N (where N is an integer greater than or equal to 1). In embodiments a child partition can be considered the basic unit of isolation supported by the hypervisor 202, that is, each child partition can be mapped to a set of hardware resources, e.g., memory, devices, logical processor cycles, etc., that is under control of the hypervisor 202 and/or the parent partition and hypervisor 202 can isolate one partition from accessing another partition's resources. In embodiments the hypervisor 202 can be a stand-alone software product, a part of an operating system, embedded within firmware of the motherboard, specialized integrated circuits, or a combination thereof.

In the above example, computer system 100 includes a parent partition 204 that can also be thought of as domain 0 in the open source community. Parent partition 204 can be configured to provide resources to guest operating systems executing in child partitions 1-N by using virtualization service providers 228 (VSPs) that are also known as back-end drivers in the open source community. In this example architecture the parent partition 204 can gate access to the underlying hardware. The VSPs 228 can be used to multiplex the interfaces to the hardware resources by way of virtualization service clients (VSCs) that are also known as front-end drivers in the open source community. Each child partition can include one or more virtual processors such as virtual processors 230 through 232 that guest operating systems 220 through 222 can manage and schedule threads to execute thereon. Generally, the virtual processors 230 through 232 are executable instructions and associated state information that provide a representation of a physical processor with a specific architecture. For example, one virtual machine may have a virtual processor having characteristics of an Intel x86 processor, whereas another virtual processor may have the characteristics of a PowerPC processor. The virtual processors in this example can be mapped to logical processors of the computer system such that the instructions that effectuate the virtual processors will be backed by logical processors. Thus, in these example embodiments, multiple virtual processors can be simultaneously executing while, for example, another logical processor is executing hypervisor instructions. Generally speaking, and as illustrated by the figures, the combination of virtual processors, various VSCs, and memory in a partition can be considered a virtual machine such as virtual machine 240 or 242.

Generally, guest operating systems 220 through 222 can include any operating system such as, for example, operating systems from Microsoft®, Apple®, the open source community, etc. The guest operating systems can include user/kernel modes of operation and can have kernels that can include schedulers, memory managers, etc. A kernel mode can include an execution mode in a logical processor that grants access to at least privileged processor instructions. Each guest operating system 220 through 222 can have associated file systems that can have applications stored thereon such as terminal servers, e-commerce servers, email servers, etc., and the guest operating systems themselves. The guest operating systems 220-222 can schedule threads to execute on the virtual processors 230-232 and instances of such applications can be effectuated.

Referring now to FIG. 4, illustrated is an alternative architecture that can be used to effectuate virtual machines. FIG. 4 depicts similar components to those of FIG. 3, however in this example embodiment the hypervisor 202 can include the virtualization service providers 228 and device drivers 224, and parent partition 204 may contain configuration utilities 236. In this architecture, hypervisor 202 can perform the same or similar functions as the hypervisor 202 of FIG. 2. The hypervisor 202 of FIG. 4 can be a stand alone software product, a part of an operating system, embedded within firmware of the motherboard or a portion of hypervisor 202 can be effectuated by specialized integrated circuits. In this example parent partition 204 may have instructions that can be used to configure hypervisor 202 however hardware access requests may be handled by hypervisor 202 instead of being passed to parent partition 204.

Figure 5:
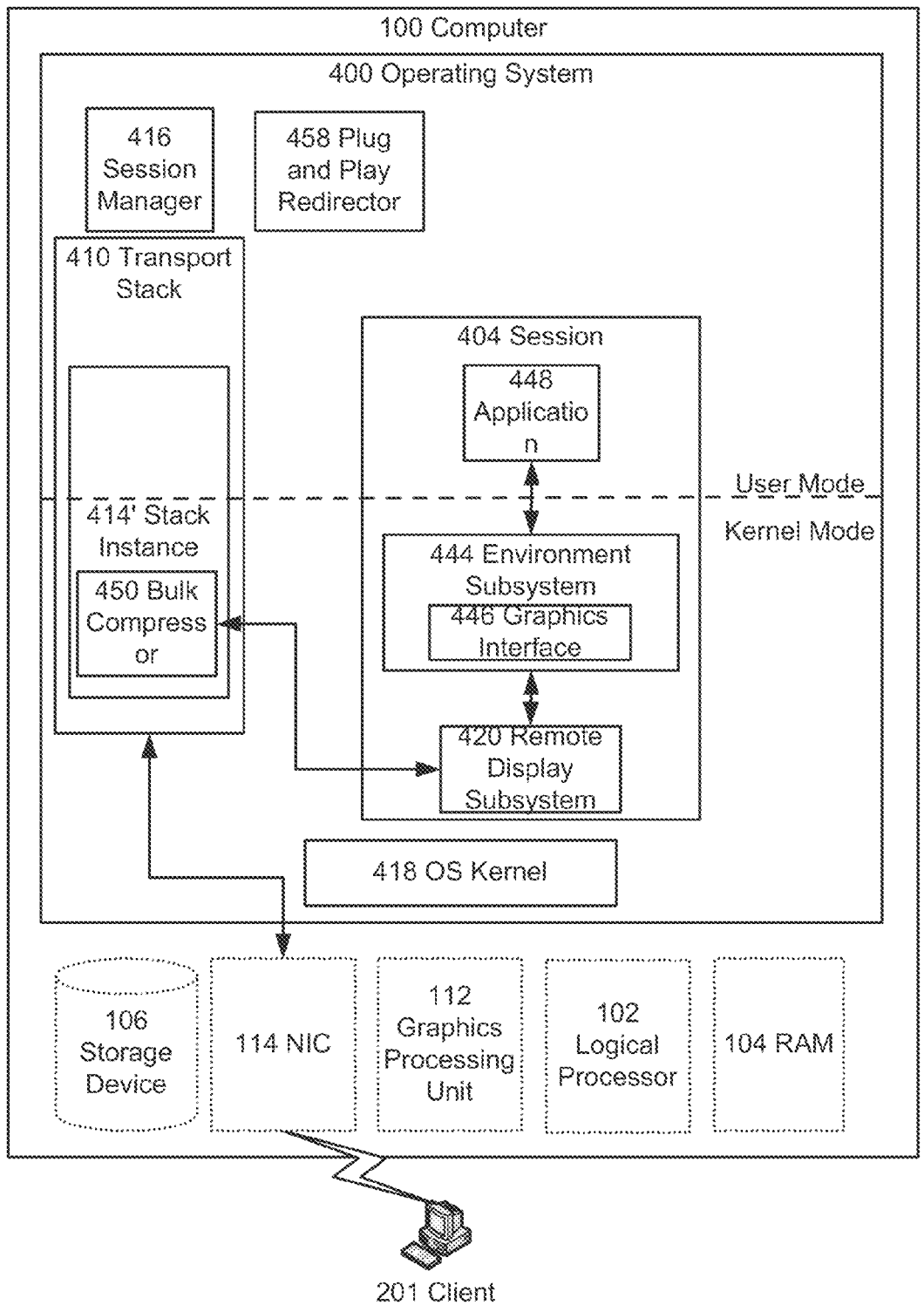
FIG. 5 illustrates a computer system including circuitry for effectuating remote desktop services.

Referring now to FIG. 5, computer 100 may include circuitry configured to provide remote desktop services to connecting clients. In an example embodiment, the depicted operating system 400 may execute directly on the hardware or a guest operating system 220 or 222 may be effectuated by a virtual machine such as VM 216 or VM 218. The underlying hardware 208, 210, 234, 212, and 214 is indicated in the illustrated type of dashed lines to identify that the hardware can be virtualized.

Remote services can be provided to at least one client such as client 401 (while one client is depicted remote services can be provided to more clients.) The example client 401 can include a computer terminal that is effectuated by hardware configured to direct user input to a remote server session and display user interface information generated by the session. In another embodiment, client 401 can be effectuated by a computer that includes similar elements as those of computer 100 FIG. 1*b*. In this embodiment, client 401 can include circuitry configured to effect operating systems and circuitry configured to emulate the functionality of terminals, e.g., a remote desktop client application that can be executed by one or more logical processors 102. One skilled in the art can appreciate that the circuitry configured to effectuate the operating system can also include circuitry configured to emulate a terminal.

Each connecting client can have a session (such as session 404) which allows the client to access data and applications stored on computer 100. Generally, applications and certain operating system components can be loaded into a region of memory assigned to a session. Thus, in certain instances some OS components can be spawned N times (where N represents the number of current sessions). These various OS components can request services from the operating system kernel 418 which can, for example, manage memory; facilitate disk reads/writes; and configure threads from each session to execute on the logical processor 102. Some example subsystems that can be loaded into session space can include the subsystems that generates desktop environments, the subsystems that track mouse movement within the desktop, the subsystems that translate mouse clicks on icons into commands that effectuate an instance of a program, etc. The processes that effectuate these services, e.g., tracking mouse movement, are tagged with an identifier associated with the session and are loaded into a region of memory that is allocated to the session.

A session can be generated by a session manager 416, e.g., a process. For example, the session manager 416 can initialize and manage each remote session by generating a session identifier for a session space; assigning memory to the session space; and generating system environment variables and instances of subsystem processes in memory assigned to the session space. The session manager 416 can be invoked when a request for a remote desktop session is received by the operating system 400.

A connection request can first be handled by a transport stack 410, e.g., a remote desktop protocol (RDP) stack. The transport stack 410 instructions can configure logical processor 102 to listen for connection messages on a certain port and forward them to the session manager 416. When sessions are generated the transport stack 410 can instantiate a remote desktop protocol stack instance for each session. Stack instance 414 is an example stack instance that can be generated for session 404. Generally, each remote desktop protocol stack instance can be configured to route output to an associated client and route client input to an environment subsystem 444 for the appropriate remote session.

As shown by the figure, in an embodiment an application 448 (while one is shown others can also execute) can execute and generate an array of bits. The array can be processed by a graphics interface 446 which in turn can render bitmaps, e.g., arrays of pixel values, that can be stored in memory. As shown by the figure, a remote display subsystem 420 can be instantiated which can capture rendering calls and send the calls over the network to client 401 via the stack instance 414 for the session.

In addition to remoting graphics and audio, a plug and play redirector 458 can also be instantiated in order to remote diverse devices such as printers, mp3 players, client file systems, CD ROM drives, etc. The plug and play redirector 458 can receive information from a client side component which identifies the peripheral devices coupled to the client 401. The plug and play redirector 458 can then configure the operating system 400 to load redirecting device drivers for the peripheral devices of the client 401. The redirecting device drivers can receive calls from the operating system 400 to access the peripherals and send the calls over the network to the client 401.

As discussed above, clients may use a protocol for providing remote presentation services such as Remote Desktop Protocol (RDP) to connect to a resource using terminal services. When a remote desktop client connects to a terminal server via a terminal server gateway, the gateway may open a socket connection with the terminal server and redirect client traffic on the remote presentation port or a port dedicated to remote access services. The gateway may also perform certain gateway specific exchanges with the client using a terminal server gateway protocol transmitted over HTTPS.

Figure 6:
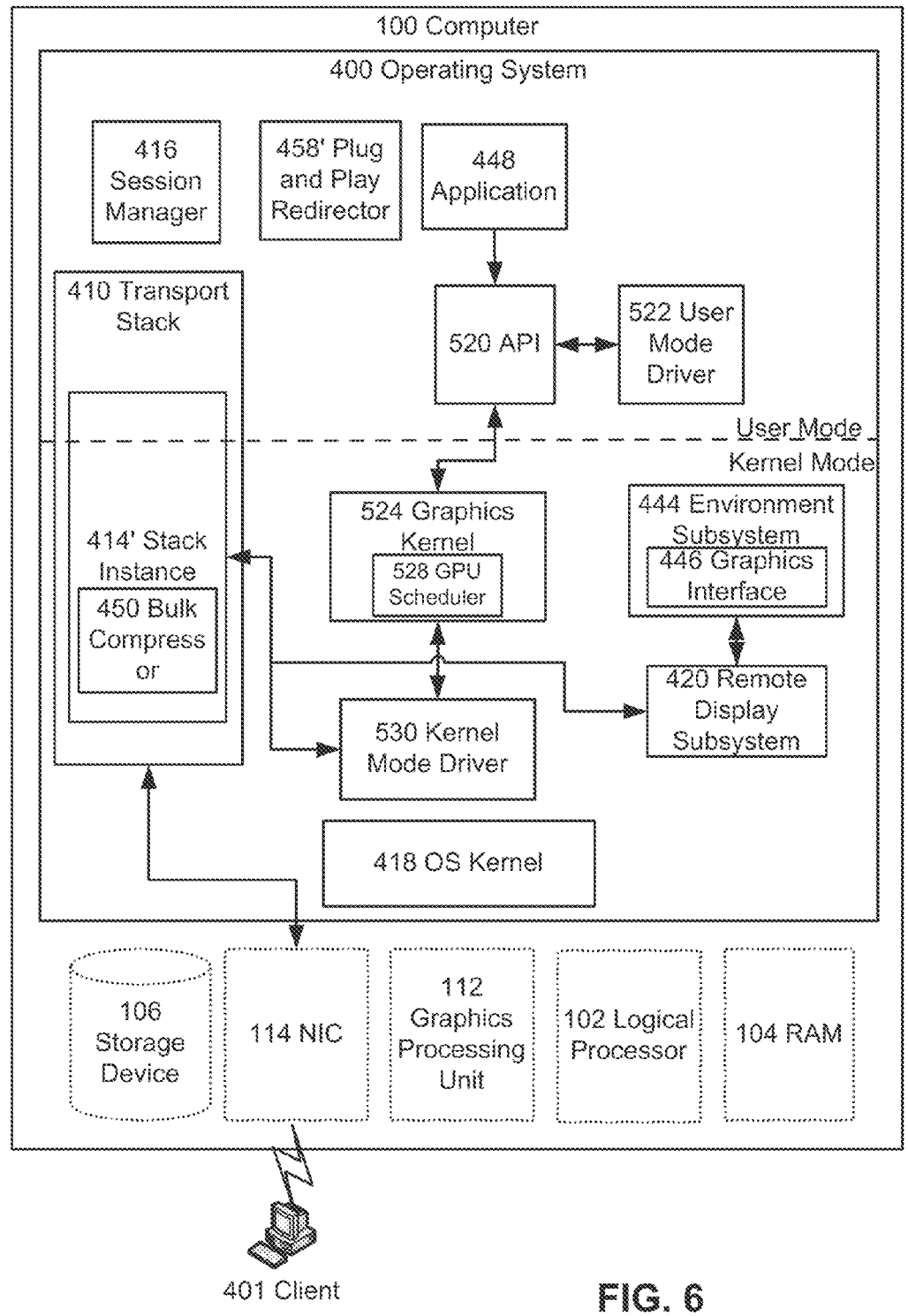
FIG. 6 illustrates a computer system including circuitry for effectuating remote services.

Turning to FIG. 6, depicted is a computer system 100 including circuitry for effectuating remote services and for incorporating aspects of the present disclosure. As shown by the figure, in an embodiment a computer system 100 can include components similar to those described in FIG. 2 and FIG. 5, and can effectuate a remote presentation session. In an embodiment of the present disclosure a remote presentation session can include aspects of a console session, e.g., a session spawned for a user using the computer system, and a remote session. Similar to that described above, the session manager 416 can initialize and manage the remote presentation session by enabling/disabling components in order to effectuate a remote presentation session.

One set of components that can be loaded in a remote presentation session are the console components that enable high fidelity remoting, namely, the components that take advantage of 3D graphics and 2D graphics rendered by 3D hardware.

3D/2D graphics rendered by 3D hardware can be accessed using a driver model that includes a user mode driver 522, an API 520, a graphics kernel 524, and a kernel mode driver 530. An application 448 (or any other process such as a user interface that generates 3D graphics) can generate API constructs and send them to an application programming interface 520 (API) such as Direct3D from Microsoft®. The API 520 in turn can communicate with a user mode driver 522 which can generates primitives, e.g., the fundamental geometric shapes used in computer graphics represented as vertices and constants which are used as building blocks for other shapes, and stores them in buffers, e.g., pages of memory. In one embodiment the application 448 can declare how it is going to use the buffer, e.g., what type of data it is going to store in the buffer. An application, such as a videogame, may use a dynamic buffer to store primitives for an avatar and a static buffer for storing data that will not change often such as data that represents a building or a forest.

Continuing with the description of the driver model, the application can fill the buffers with primitives and issue execute commands. When the application issues an execute command the buffer can be appended to a run list by the kernel mode driver 530 and scheduled by the graphics kernel scheduler 528. Each graphics source, e.g., application or user interface, can have a context and its own run list. The graphics kernel 524 can be configured to schedule various contexts to execute on the graphics processing unit 112. The GPU scheduler 528 can be executed by logical processor 102 and the scheduler 528 can issue a command to the kernel mode driver 530 to render the contents of the buffer. The stack instance 414 can be configured to receive the command and send the contents of the buffer over the network to the client 401 where the buffer can be processed by the GPU of the client.

Illustrated now is an example of the operation of a virtualized GPU as used in conjunction with an application that calls for remote presentation services. Referring to FIG. 6, in an embodiment a virtual machine session can be generated by a computer 100. For example, a session manager 416 can be executed by a logical processor 102 and a remote session that includes certain remote components can be initialized. In this example the spawned session can include a kernel 418, a graphics kernel 524, a user mode display driver 522, and a kernel mode display driver 530. The user mode driver 522 can generate graphics primitives that can be stored in memory. For example, the API 520 can include interfaces that can be exposed to processes such as a user interface for the operating system 400 or an application 448. The process can send high level API commands such as such as Point Lists, Line Lists, Line Strips, Triangle Lists, Triangle Strips, or Triangle Fans, to the API 420. The API 520 can receive these commands and translate them into commands for the user mode driver 522 which can then generate vertices and store them in one or more buffers. The GPU scheduler 528 can run and determine to render the contents of the buffer. In this example the command to the graphics processing unit 112 of the server can be captured and the content of the buffer (primitives) can be sent to client 401 via network interface card 114. In an embodiment, an API can be exposed by the session manager 416 that components can interface with in order to determine whether a virtual GPU is available.

In an embodiment a virtual machine such as virtual machine 240 of FIG. 3 or 4 can be instantiated and the virtual machine can serve as a platform for execution for the operating system 400. Guest operating system 220 can embody operating system 400 in this example. A virtual machine may be instantiated when a connection request is received over the network. For example, the parent partition 204 may include an instance of the transport stack 410 and may be configured to receive connection requests. The parent partition 204 may initialize a virtual machine in response to a connection request along with a guest operating system including the capabilities to effectuate remote sessions. The connection request can then be passed to the transport stack 410 of the guest operating system 220. In this example each remote session may be instantiated on an operating system that is executed by its own virtual machine.

In one embodiment a virtual machine can be instantiated and a guest operating system 220 embodying operating system 400 can be executed. Similar to that described above, a virtual machine may be instantiated when a connection request is received over the network. Remote sessions may be generated by an operating system. The session manager 416 can be configured to determine that the request is for a session that supports 3D graphics rendering and the session manager 416 can load a console session. In addition to loading the console session the session manager 416 can load a stack instance 414' for the session and configure system to capture primitives generated by a user mode display driver 522.

The user mode driver 522 may generate graphics primitives that can be captured and stored in buffers accessible to the transport stack 410. A kernel mode driver 530 can append the buffers to a run list for the application and a GPU scheduler 528 can run and determine when to issue render commands for the buffers. When the scheduler 528 issues a render command the command can be captured by, for example, the kernel mode driver 530 and sent to the client 401 via the stack instance 414'.

The GPU scheduler 528 may execute and determine to issue an instruction to render the content of the buffer. In this example the graphics primitives associated with the instruction to render can be sent to client 401 via network interface card 114.

In an embodiment, at least one kernel mode process can be executed by at least one logical processor 112 and the at least one logical processor 112 can synchronize rendering vertices stored in different buffers. For example, a graphics processing scheduler 528, which can operate similarly to an operating system scheduler, can schedule GPU operations. The GPU scheduler 528 can merge separate buffers of vertices into the correct execution order such that the graphics processing unit of the client 401 executes the commands in an order that allows them to be rendered correctly.

One or more threads of a process such as a videogame may map multiple buffers and each thread may issue a draw command. Identification information for the vertices, e.g., information generated per buffer, per vertex, or per batch of vertices in a buffer, can be sent to the GPU scheduler 528. The information may be stored in a table along with identification information associated with vertices from the same, or other processes and used to synchronize rendering of the various buffers.

An application such as a word processing program may execute and declare, for example, two buffers—one for storing vertices for generating 3D menus and the other one storing commands for generating letters that will populate the menus. The application may map the buffer and; issue draw commands. The GPU scheduler 528 may determine the order for executing the two buffers such that the menus are rendered along with the letters in a way that it would be pleasing to look at. For example, other processes may issue draw commands at the same or a substantially similar time and if the vertices were not synchronized vertices from different threads of different processes could be rendered asynchronously on the client 401 thereby making the final image displayed seem chaotic or jumbled.

A bulk compressor 450 can be used to compress the graphics primitives prior to sending the stream of data to the client 401. In an embodiment the bulk compressor 450 can be a user mode (not shown) or kernel mode component of the stack instance 414 and can be configured to look for similar patterns within the stream of data that is being sent to the client 401. In this embodiment, since the bulk compressor 450 receives a stream of vertices, instead of receiving multiple API constructs, from multiple applications, the bulk compressor 450 has a larger data set of vertices to sift through in order to find opportunities to compress. That is, since the vertices for a plurality of processes are being remoted, instead of diverse API calls, there is a larger chance that the bulk compressor 450 will be able to find similar patterns in a given stream.

In an embodiment, the graphics processing unit 112 may be configured to use virtual addressing instead of physical addresses for memory. Thus, the pages of memory used as buffers can be paged to system RAM or to disk from video memory. The stack instance 414' can be configured to obtain the virtual addresses of the buffers and send the contents from the virtual addresses when a render command from the graphics kernel 528 is captured.

An operating system 400 may be configured, e.g., various subsystems and drivers can be loaded to capture primitives and send them to a remote computer such as client 401. Similar to that described above, a session manager 416 can be executed by a logical processor 102 and a session that includes certain remote components can be initialized. In this example the spawned session can include a kernel 418, a graphics kernel 524, a user mode display driver 522, and a kernel mode display driver 530.

A graphics kernel may schedule GPU operations. The GPU scheduler 528 can merge separate buffers of vertices into the correct execution order such that the graphics processing unit of the client 401 executes the commands in an order that allows them to be rendered correctly.

All of these variations for implementing the above mentioned partitions are just exemplary implementations, and nothing herein should be interpreted as limiting the disclosure to any particular virtualization aspect.

Remote Presentation Over Lossy Transport with Forward Error Correction

The process of compressing, encoding and decoding graphics data as referred to herein may generally use one or more methods and systems described in commonly assigned U.S. Pat. No. 7,460,725 entitled "System And Method For Effectively Encoding And Decoding Electronic Information," hereby incorporated by reference in its entirety. The process of transporting such data may incorporate techniques described in U.S. patent application No. 12/364,520, now U.S. Pat. No. 8,228,800 entitled "Optimized Transport Protocol For Delay-Sensitive Data,"Attorney Docket No. 325618.01.

In various methods and systems disclosed herein, improvements to the transmission of remote presentation graphics data to a client computer may be implemented to provide a more timely and rich user experience. The embodiments disclosed herein for encoding and transmitting graphics data may be implemented using various combinations of hardware and software processes. In some embodiments, functions may be executed entirely in hardware. In other embodiments, functions may be performed entirely in software. In yet further embodiments, functions may be implemented using a combination of hardware and software processes. Such processes may further be implemented using one or more CPUs and/or one or more specialized processors such as a graphics processing unit (GPU) or other dedicated graphics rendering devices.

In remote desktop scenarios the graphics content of a user's desktop located on a host computer (e.g., the server) is typically streamed to another computer (e.g., the client). The server and the client will exchange the desktop graphics data in a well defined protocol or format. Microsoft's™ Remote Desktop Protocol (RDP) is an example of such a protocol. The RDP protocol is a stream oriented application-layer protocol that may use a stream based transport-layer protocol such as the Transmission Control Protocol (TCP) for exchanging data with the client. In the following discussion, we define "application latency" or "application delay" for a portion of the stream as the latency experienced by the application-layer protocol in receiving that portion of the stream. This can be defined to be the time difference between when the application wishes to send the portion to when the receiving application receives that portion. We define "transmission latency" as the latency experienced by individual packets sent by the transport protocol. "Transmission loss", "loss", or "loss rate" refers to the probability of that packets sent by the transport protocol will be lost. Protocols such as the TCP protocol typically exhibit high application latency when the underlying transport is a wide area network (WAN) connection with high transmission latency and loss. If such a link is used for RDP traffic, such application latencies may result in a negative user experience because the desktop graphics data may be delivered to the client in a time delayed fashion.

Accordingly, when providing a remote presentation session with a client computer using a protocol such as RDP, in some scenarios it may be desirable to execute the protocol over a lossy transport. For example, when a particular high latency link is experiencing a high loss rate, the use of some stream-based protocols such as TCP may result in a significant delay. In such protocols, when data packets are not properly received or lost, the lost data packets must be retransmitted before progress can be made in the processing of the received data. Thus in such cases it may be advantageous to use a lossy datagram transport mechanism rather than a streaming lossless transport mechanism. Lossy protocols can be any type of protocol that may generally be characterized as protocol with lossy semantics. Such protocols may not provide verification of delivery, retransmission of lost data, and implied or explicit ordering of data packets. Such protocols may also be referred to as a datagram protocol. By being able to transmit data on a lossy datagram protocol, much of the delay caused by recovery mechanisms for lost packets may be avoided. In various embodiments disclosed herein, methods are described that address the above issues by providing a loss tolerant graphics exchange protocol and thus allowing the use of a non-stream based protocol such as User Datagram Protocol (UDP).

Figure 7:
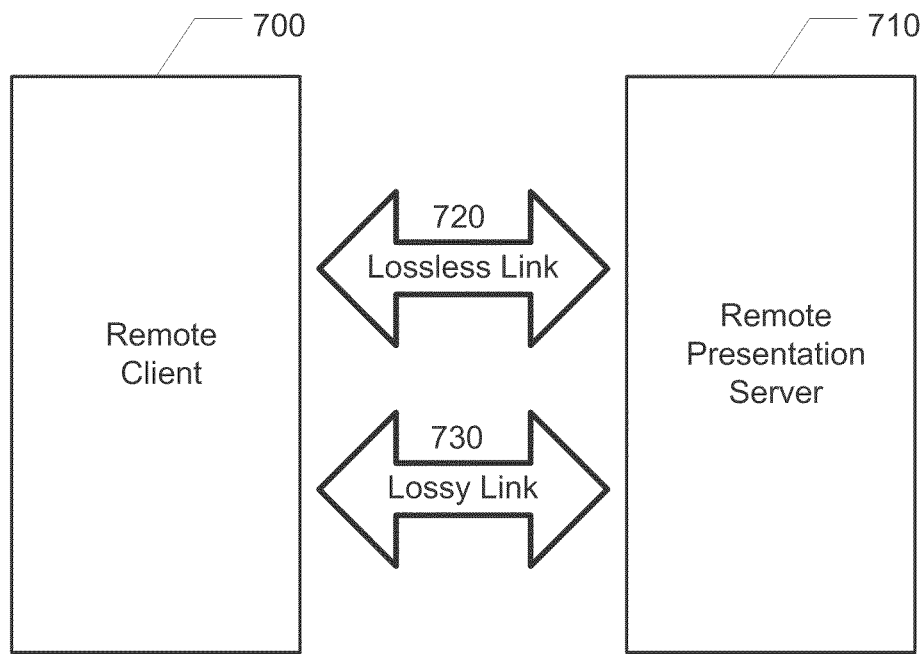
FIG. 7 illustrates an example architecture incorporating aspects of the methods disclosed herein.

In one embodiment, a UDP connection may be provided for transmitting the graphics data. FIG. 7 depicts a connection between a remote presentation server 710 and a remote client 700. In typical remote presentation configurations, the client and the server exchange information through the lossless transport 720. Such information may comprise both control and graphics data. In an embodiment, a lossy transport 730 is added to the connection between the client and the server. The lossy transport 730 may be used to exchange the graphics data. The lossless transport 720 may be used for control type data, such as a list of encryption keys or bitmap cache confirmation. In other embodiments, only the lossy transport 730 may be used for the connection between the client and the server.

As mentioned previously, in a remote/virtual desktop environment, graphics data is typically rendered on the host partition and transferred to the client using remote presentation protocols such as RDP after some form of compression is applied to the data. Graphics data typically consists of various elements that may have different tolerances to data loss and transmission delays. In addition, the overall remote desktop experience may include other elements with differences in their requirements for delivery reliability and transmission delays. Examples of such display and experience elements include:

- Remote protocol control data, which needs reliable and in-sequence delivery. Remote protocol control data needs to be delivered quickly, but the data may not have the real-time constraints.
- User input data (e.g., keyboard/mouse), which needs reliable and in-sequence delivery. User input data also needs to be delivered quickly to maintain responsiveness.
- Video Playback, which needs fast delivery and a consistent throughput, but can tolerate loss and out-of-sequence delivery
- Audio data, which needs fast/real-time delivery, but can tolerate loss and out-of-sequence delivery
- Printer data which needs reliable and in-sequence delivery. However, Printer data may tolerate higher delays during delivery.

In an embodiment, a link characteristics detector may be provided that continuously monitors the link between the client and server for characteristics such as available bandwidth, end-to-end latency, and data loss. The link characteristics detector may also ensure that the measurements are performed such that they take into account the data flowing through all the channels between the client and server. This data may then be provided to the channel manager to optimize the channels currently in use or subsequently opened.

A link characteristics detector may incorporate some of the functionality described in common assigned U.S. patent application No. 12/719,669 (Attorney Docket MVIR-0626, filed on Mar. 8, 2010), hereby incorporated in its entirety.

On a high latency lossy network typically found in WAN situations, the real time/interactive remote presentation experience using a remote presentation protocol such as RDP over TCP/IP may not provide an adequate user experience. In various embodiments, a remote presentation protocol may use a transport stack based on a lossy protocol such as UDP, combined with forward error correction (FEC) to provide improvements to the user experience when using remote presentation services such as the remoting of desktops.

In an embodiment, a remote presentation data stream may be transmitted over a bi-directional datagram based transport that supports data and feedback encoding, packet loss detection, packet retransmission, forward error correction and rate control. Such a transport may provide lossless and in-order data delivery based on re-transmission and FEC. Alternatively, the transport can be lossy and include a capability to report lost packets to the remote presentation layer.

In a preferred embodiment, a datagram based, bi-directional transport may be provided that incorporates dynamic detection and adjustable forward error correction to reduce latency on a high loss and high latency network. The transport interface may support 100% lossless and in-order data delivery, or partially lossy data delivery. The transport may be integrated as part of a remote presentation protocol stack for either the entire data stream or a portion of the data stream.

Packet delays typically consist of one or more of: time spent in the sender queue, network propagation delay, network queuing delay, and time spent retransmitting or decoding FEC. Network propagation delays typically cannot be improved at the remote presentation level. Delays due to time spent in the send queue may be improved by better application rate control. Network queuing delay and time spent retransmitting or decoding FEC may be improved by modifying the transport protocol. In various embodiments, the disclosed techniques may be used to improve the remote presentation performance through improvement of network queuing delay and FEC retransmission and decoding.

Remote presentation protocols are typically session level protocols that use a TCP-type connection between the client and the host. The protocol typically multiplexes virtual channel data and primary graphics channel on such a connection. On a lossless high speed network, TCP typically provides reliability and guaranteed delivery of the multiplexed payload meeting the response time needs of interactive bi-directional traffic.

On a WAN, when round trip time exceeds 50 ms and where packet losses exceed 1-2%, a TCP-type connection may exhibit one or more of the following issues:

1. Recovery of lost packets through retransmit timeout mechanisms often introduce delays that negatively impact real time end user experience
2. Congestion control and avoidance algorithms may result in the collapse of the TCP send window, resulting in a slow start phase
3. The receive queue may build up at the client TCP layer until a lost packet is received for strict in-order delivery.

Such issues may cause graphics channel artifacts such as tearing and jitter, affecting quality of the user experience and delays exceeding the physical link round trip times. To improve the user experience using a remote presentation protocol over a high loss and high latency WAN, the remote presentation protocol may be integrated with a datagram based transport. In one embodiment, such an integrated protocol may be configured to support:

1) Encoding and decoding of packets including both data and feedback
2) Lossless or reduced loss transport based on Retransmission (ARQ) combined with Forward Error Correction (FEC)
3) Ongoing measurement of RTT, RTO and packet delay
4) Dynamically evaluate loss probability to determine and adjust ratio of FEC
5) Congestion management based on dynamically detecting increase in packet delay
6) Fast data transmission rate ramp-up based on detecting non-increase in packet delay.

The transport layer may be integrated into both the server and client, and may provide the following capabilities:

1) Ability to provide a lossless transport with in-order data delivery

2) Ability to provide a lossy transport and report back data loss or out-of-order delivery to RDP layer
3) Handles all RDP stream over a single transport over UDP, or co-exist with TCP based transport(s).

Figure 8:
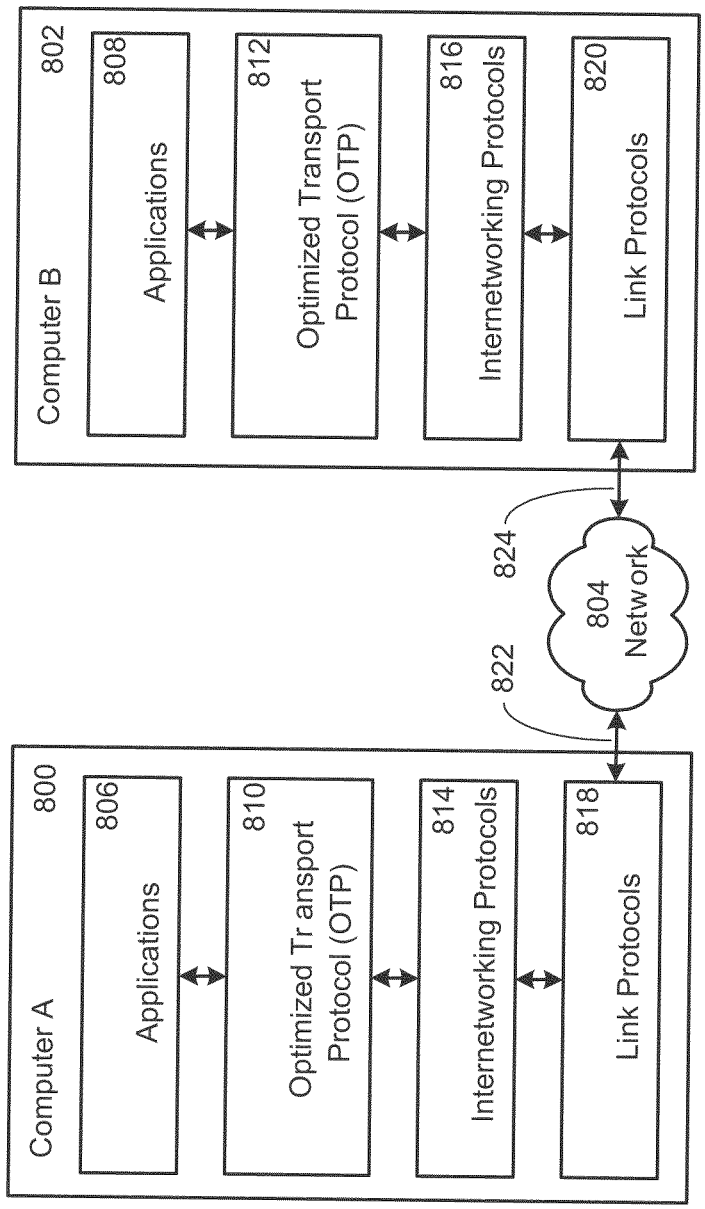
FIG. 8 illustrates an example architecture incorporating aspects of the methods disclosed herein.

Referring to FIG. 8, the transmission of data packets from one computer 800 over the network 804 to another computer 802 can be delayed for a variety of reasons. The network 804 can be inherently "lossy," resulting in transmitted data packets either being lost in the network before they reach their destination, or being corrupted when they reach their destination. Consequently, the lost or corrupted data packets would have to be retransmitted over the network. Exemplary networks which are inherently lossy may include, for example, wireless networks and networks comprising malfunctioning routers. The network 804 can also experience congestion due to bandwidth limitations in the network resulting in data packets having to be queued on the sending computer before an opportunity to transmit them over the network. Significant network congestion can also result in transmitted data packets being lost in the network due to factors such as router queue overruns and the like. These packet transmission delays are exacerbated in situations where the data packets are generated by their source application in a bursty manner.

In various embodiments, a packet transmission flow control function may be provided that reduces transmission delays associated with transmitting original data packets generated by the local application over a network to a remote application based on the current state of the network. The transmission flow control function may reduce network congestion and related original data packet transmission delays that can occur when the original data packets are transmitted over the network at a rate which exceeds the network's currently available bandwidth. Accordingly, the transmission flow control function may also reduce the round-trip time (RTT) for transmitting each original data packet.

In another embodiment, a hybrid rate plus window based congestion protocol (which controls the rate of packet transmission into the network) may be implemented. Such a hybrid rate plus window based congestion protocol may provide low queuing delay, near zero packet loss, fair allocation of network resources among multiple flows, and full link utilization. The hybrid protocol may use congestion window to control the maximum number of outstanding bits, a transmission rate to control the rate of packets entering the network (packet pacing), a queuing delay based rate update to control queuing delay within tolerated bounds (and minimize any packet loss), aggressive ramp-up/graceful back-off to fully utilize the link capacity, and provide fairness among multiple flows.

Existing congestion control protocols are typically window based or delay based. Window based protocols have the advantage that even with the use of aggressive ramp up strategies, the sending rate does not exceed the link capacity by more than 2× at any given moment (since the sender can only send more packets once an ACK or NACK (timeout)). However, since window based protocols can send a full burst of packets at once, some packets suffer a large queuing delay. Thus, the congestion detection thresholds and the actual maximum queuing delay achieved is usually no less than the round-trip time (RTT). For some applications (e.g. VoIP, conferencing, interactive software applications) this may not be tolerable. In addition, if the network router buffers have memory equal to the bandwidth-delay product of the network, such congestion control protocols may produce packet loss (even if they respond to delay signals such as TCP-Vegas or FAST TCP).

Rate based protocols, on the other hand, can directly control the rate of packet transmission. However, care must be taken in not ramping up the rate too aggressively otherwise they can result in oscillatory behavior or even packet loss. In an embodiment, a joint window plus rate based protocol may be provided. The use of a window provides the advantages of a window based protocol. However, to prevent all packets from going out at once, the packets may be paced using a transmission rate. The use of pacing may result in very low queuing delay (depending on the congestion detection thresholds) and practically zero packet loss.

However, the use of a low congestion detection threshold may result in potential link under-utilization if the congestion detection threshold (in units of time) is less than the round-trip time (RTT) of the link. For example, the same problem may occur with TCP when network router buffer size (as measured in units of time) is less than the RTT. This may occur in high bandwidth-delay product networks since even a relatively large amount of network router buffer memory (in units of bits) is small in units of time. For example, a 100 Mb buffer with network capacity of 2 Gbps will only be a 100/2000=50 ms buffer. If the link RTT is 100 ms, then this will result in link under-utilization even if the system does not back off until congestion induced packet loss takes place.

If it is assumed that the queuing delay thresholds are set in the range of 10-20 ms, then so long as the RTT is larger than the threshold, link under-utilization may occur. One solution is to simply ramp up more aggressively when far from congestion, and reduce the ramp when congestion approaches. Similarly, once congestion is encountered, back off may be less aggressive when congestion is mild, and back off may be more aggressive once congestion level is high. The congestion level is typically found using queuing delay as a metric to determine when congestion may occur.

By considering these factors, full link utilization may be achieved. So long as rate updates are performed using an additive-increase, multiplicative-decrease (AIMD) manner, fairness across multiple flows can be achieved. In addition, the rate control update may be performed using a three zone scheme. The congestion level may be classified based upon average queuing delay, queuing delay trend, and packet loss. The transmission rate may be updated depending on which zone is currently active so as to keep queuing delay tightly controlled within some desired bound. Queuing delay may be computed so as to not be sensitive to clock offset or clock skew (aka clock drift).

A goal of a congestion control protocol is to control the transmission rate so that sent packets suffer minimal network queuing delay and loss caused by congestion while sustaining throughput close to the available network bandwidth and ensure fair sharing of network resources. Most congestion control protocols use an additive-increase multiplicative-decrease (AIMD) scheme to adjust the transmission rate (R) or window (W) at the nth time instant using $$W_{n+1} += \begin{cases} W_n + \alpha & \text{if no congestion} \\ W_n(1-\beta) & \text{if congestion} \end{cases} \quad (1)$$

AIMD control schemes have the property that they guarantee fairness regardless of network state. Details of an AIMD scheme include its definitions of congestion, $\alpha$ (amount to increase), and $\beta$ (amount to decrease). Congestion may be defined in terms of loss, delay, and explicit congestion notification signals (if present). Thus an AIMD scheme may be used from a TCP variant as the base for congestion control. The congestion control strategy may be characterized by the following objectives.

Fast adaptation to available bandwidth: Since it is desirable to tolerate small queuing delays (smaller than RTT and buffer size), the function may ramp up quickly to prevent link under-utilization.

Sensitive to network delay: To reduce queuing delay and packet loss, the function may use queuing delay as an indicator of congestion to control the rate.

Based on the above objectives, a congestion control function may be provided that is characterized by one or more of the following.

Rate based: Use a combination of rate based plus window based congestion control to introduce packets at a relatively steady rate into the network. This leads to a more steady network behavior in terms of delay which is needed to obtain accurate queuing delay measurements.

Fast ramp up: The function may ramp up aggressively when far from congestion using queuing delay as an indicator of how far the current state is from congestion.

Graceful back off: Instead of backing off by a constant factor when congested, the function may back off based on the level of congestion. When entering congestion, the back-off may not be as aggressive as when heavily congested (as indicated by queuing delay).

Delay constrained congestion detection: The definition of congestion may be modified so that queuing delay can be accurately controlled within some desired range. The protocol may operate on epochs of length L that are defined to be units of time equal to the estimated round trip propagation time (the minimum RTT seen so far). At the end of each epoch, the epoch length is updated, the congestion level classified into one of three zones as described below, and the transmission rate updated as described below. The window plus rate based rate control is performed as described below.

Instead of simply defining congestion as a binary event (congestion or no congestion), in an embodiment a more continuous definition of congestion level may be used, using both packet loss and one way delay (OWD). An estimate of the current queuing delay may be computed by taking an average of the relative one way delay (ROWD) measurements of all packets which have been acknowledged in the previous epoch which just ended. The relative one-way delay is computed as ROWD=OWD−$OWD_{min}$, where OWD is the actual one-way delay computed as the received time using the receiver's clock minus the sent time using the sender's clock. $OWD_{min}$ is the minimum OWD value seen so far. Although OWD is sensitive to clock offset, ROWD is not since $OWD_{min}$ is an estimate of the propagation delay plus the clock offset. To prevent ROWD measurements from being sensitive to clock drift (where one clock is running faster than the other), $OWD_{min}$ can be taken to be the minimum over some window of measurements rather than the true minimum seen so far. Let $\delta_{avg}$=avg(ROWD) be the estimate of the queuing delay. The congestion level may be classified into one of the following three zones.

Zone 1: OWD trend is non-increasing and average queuing delay is less than some threshold ($\delta_{avg} \leq d1$).

Zone 2: OWD trend is non-increasing, no packet is lost, and $d1 < \delta_{avg} \leq d2$, for $d2 > d1$.

Zone 3: OWD trend is increasing, $\delta_{avg} > d2$, or packet loss is accompanied by a delay increase ($\delta_{avg} > d1$).

If packets are being properly paced, an increasing OWD trend means buffers are building up and thus implies congestion. The congestion control protocol strives to stay in Zone 1 and Zone 2 and thus the typical queuing delay seen is between d1 and d2. By appropriately choosing d1 and d2 and accounting for typical propagation delay seen on the link, the end-to-end delay due to the network can be controlled. Delays larger than d2 will only be seen when new flows enter.

TCP uses window based congestion control, in which the window size defines the maximum number of bits that can be outstanding. The protocol is allowed to transmit a packet so long as the number of outstanding bits (F) is less than the window size (W). The outstanding bit count increases whenever a new packet is sent and reduces once the packet is acknowledged (ACK) or once the packet times out (NACK). However, in media streaming applications, rate based congestion control is frequently used. In such applications, the application controls the transmission rate directly. The sender is allowed to send packets at the rate of R bits/second, regardless of the outstanding bit count.

An advantage of window based congestion control is its self-clocking behavior since the sender is not able to increase the sending rate too fast if packets are suffering a large queuing delay (since the outstanding bit count only reduces on ACK or NACK). Windows based congestion control can send out a burst of packets with bursty applications. Though for small bursts, this can result in packets potentially having a lower end-to-end delay since they do not incur pacing delay, for a large burst of packets, some packets can experience a large queuing delay and even packet loss since the instantaneous sending rate can be much larger than the average.

In an embodiment, window based congestion control may be combined with a rate based congestion control scheme. For example, a window may be used to control the maximum number of outstanding bits, and also control the rate at which packets can enter the network using a transmission rate. The transmission rate R (in bits/sec) is the quantity which is directly adjusted based on congestion signals and a window of size W=RL (in bits) is used to control the maximum number of outstanding bits, where L is the epoch length.

In a pure rate based scheme, if a packet of size P bits is sent, then with a transmission rate of R, the next packet may only be allowed after P/R seconds. In a pure window based scheme, the packet may be sent immediately so long as F<W. In an embodiment, the packets may be paced but at the same time not exceed the window and thus a joint scheme is used. Suppose packet l of size $P_l$ bits is sent at time $t=T_l$, then we are allowed to send the next packet (l+1) of size $P_{l+1}$ at time t so long as $t > T_l + \gamma P_l/R$ and if F<W, where $\gamma \in [0.0, 1.0]$ is the pacing factor. When $\gamma=1.0$, the congestion control is fully paced and is a joint rate based control with a window. If $\gamma=0.0$, it reverts to the simple window based rate control as in TCP. Once a packet is sent at time t, the number of outstanding bits updates as $F \leftarrow F + P_{l+1}$ and the last sent time is updated $T_{l+1}=t$. Upon ACK or NACK of packet m, the outstanding bit count is reduced, $F \leftarrow F - P_m$.

At the end of every epoch, the transmission rate (R) and window (W) may be updated based on the congestion classification. The direction of change is determined using the zone classification defined above. Instead of updating the window, the transmission rate is directly updated using $$R_{n+1} = \begin{cases} R_n + \alpha & \text{if Zone} = \text{Zone 1} \\ R_n(1-\beta) & \text{if Zone} = \text{Zone 2 or Zone 3} \end{cases}$$

where $$\alpha = \begin{cases} \alpha_{max} & \text{if } \delta_{avg} \leq d_0 \\ \dfrac{\alpha_{min}\alpha_{max}(d_1 - d_0)}{\alpha_{max}(\delta_{avg} - d_0) + \alpha_{min}(d_1 - \delta_{avg})} & \text{else} \end{cases}.$$

$\alpha = \alpha_{max}$ for $\delta_{avg} \leq d_0$ and decays to $\alpha = \alpha_{min}$ by the Zone 1 boundary $d_1$. $\beta$ is given by the following if no packet loss is encountered:

$$\beta = \begin{cases} \beta_{min} + \dfrac{\beta_{mid} - \beta_{min}}{d_2 - d_1}(\delta_{avg} - d_1) & \text{if Zone} = \text{Zone 2,} \\ \beta_{min} + \dfrac{\beta_{max} - \beta_{mid}}{d_3 - d_2}(\delta_{avg} - d_2) & \begin{array}{l}\text{if Zone} = \text{Zone 3 \& OWD} \\ \text{non-increasing \& } \delta_{avg} \le d_3, \end{array} \\ \beta_{min} + \dfrac{\beta_{max} - \beta_{min}}{d_3}\delta_{avg} & \text{if } \delta_{avg} > d_3, \\ \beta_{max} & \text{if } \delta_{avg} > d_3 \end{cases}$$

where $\beta_{min}$, $\beta_{mid}$, and $\beta_{max}$ are used to control the shape of the curve. $\beta$ goes from $\beta_{min}$ to $\beta_{mid}$ during Zone 2, and then up to $\beta_{max}$ in Zone 3 if the delay trend is non-increasing. If the delay trend is increasing, then it is assumed to be a sign of congestion and $\beta$ linearly increases as a function of delay up to $\beta_{max}$ regardless of queuing delay. For cases where packet loss is encountered and $\delta_{avg} > d_1$, $\beta = \beta_{max}$.

A method for computing queuing delay which is insensitive to clock offset and clock drift is now described. Suppose the sender records packet "n" as leaving the sender at time "s" using the sender clock and then the receiver records the time the packet is received as "r" using the receiver clock. The receiver sends back this information (time received) to the sender. The sender then can compute packet "n" as having a one-way delay (OWD=r−s). OWD includes network propagation delay, network queuing delay as well as clock offset between receiver and sender. Since the propagation delay is assumed to be a constant (p), and if it is assumed that the clock offset is a constant (c), and if it is assumed that the minimum OWD seen so far (OWD_{min}) is from the state when queuing delay was zero, then we can compute the relative one-way delay and assume it to be the queuing delay (call it q) as ROWD=OWD−OWD_{min} (since q=(p+c+q)−(p+c)). However, if the protocol is running for a long time, the clock drift can become significant (i.e. c is not a constant but changes over time.

In one embodiment, a method can keep track of two minimum OWD values (OWD_{min1} and OWD_{min2}). Let OWD_{min1} be the minimum OWD seen from some time "t1" to the current time (call it t). Thus OWD_{min1} is easy to compute since it just involves an update of the form: OWD_{min1}:=min(OWD_{min1}, r−s). Let OWD_{min2} be the minimum OWD seen from some other time "t2" (where t2>t1) to the current time. The method may use ROWD=OWD−OWD_{min1} until the current time "t" exceeds some threshold (call it t3). Until t3 we use the value OWD_{min1} as the base. At t3, the method can switch to using OWD_{min2} as the base (i.e. ROWD=OWD−OWD_{min2}) and then set OWD_{min1} to be the current value. The method may keep updating both OWD_{min1} and OWD_{min2} and alternate between using one or the other as the base. This is done as shown in FIG. 12.

Figure 12:
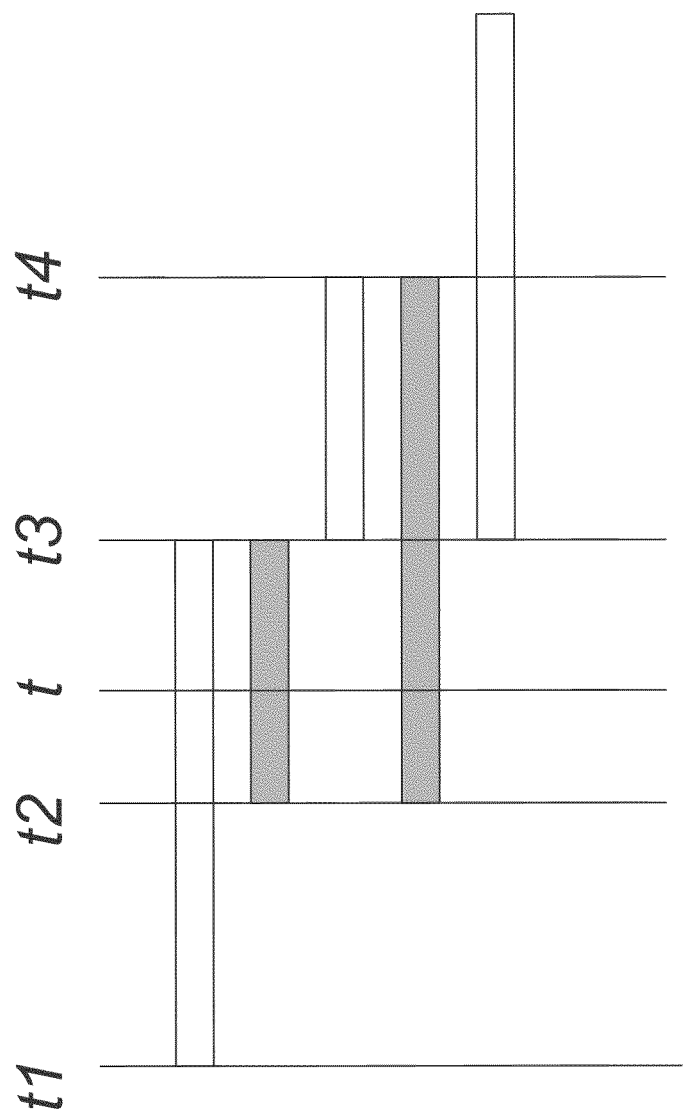
FIG. 12 illustrates a timing diagram illustrating aspects of the methods disclosed herein.

Referring to FIG. 12, the white bars indicate OWD_{min1} and the gray bars indicate computation of OWD_{min2}. From time t2 to time t3, OWD_{min1} which is being computed as minimum from t1 to the current time is used as the base to compute ROWD. During this time, OWD_{min1} is the minimum of (t2−t1) up to (t3−t1) seconds of samples. Then OWD_{min1} is reset at time t3. However, by this time, OWD_{min2} is the minimum of (t3−t2) seconds of samples and thus it is used as the base until t4. For example, suppose t1=0, t2=30, t3=60, and t4=90. Then, the base being used is the minimum of at least 30 seconds of samples and no more than the minimum of 60 seconds of samples.

In various embodiments, a packet encoding function may be provided that dynamically determines, for each output packet to be transmitted over the network at each transmission opportunity, whether the output packet will be a forward error correction (FEC) packet. If it is determined that the output packet will be an FEC packet, the packet encoding function may dynamically determine which FEC packet to transmit. These decisions may be based on the current state of the network and minimizing the expected time until each original data packet becomes useful to the remote application on the destination computer. The packet encoding function may reduce the expected original data packet transmission delays by minimizing the need for original data packet retransmission.

Figure 9:
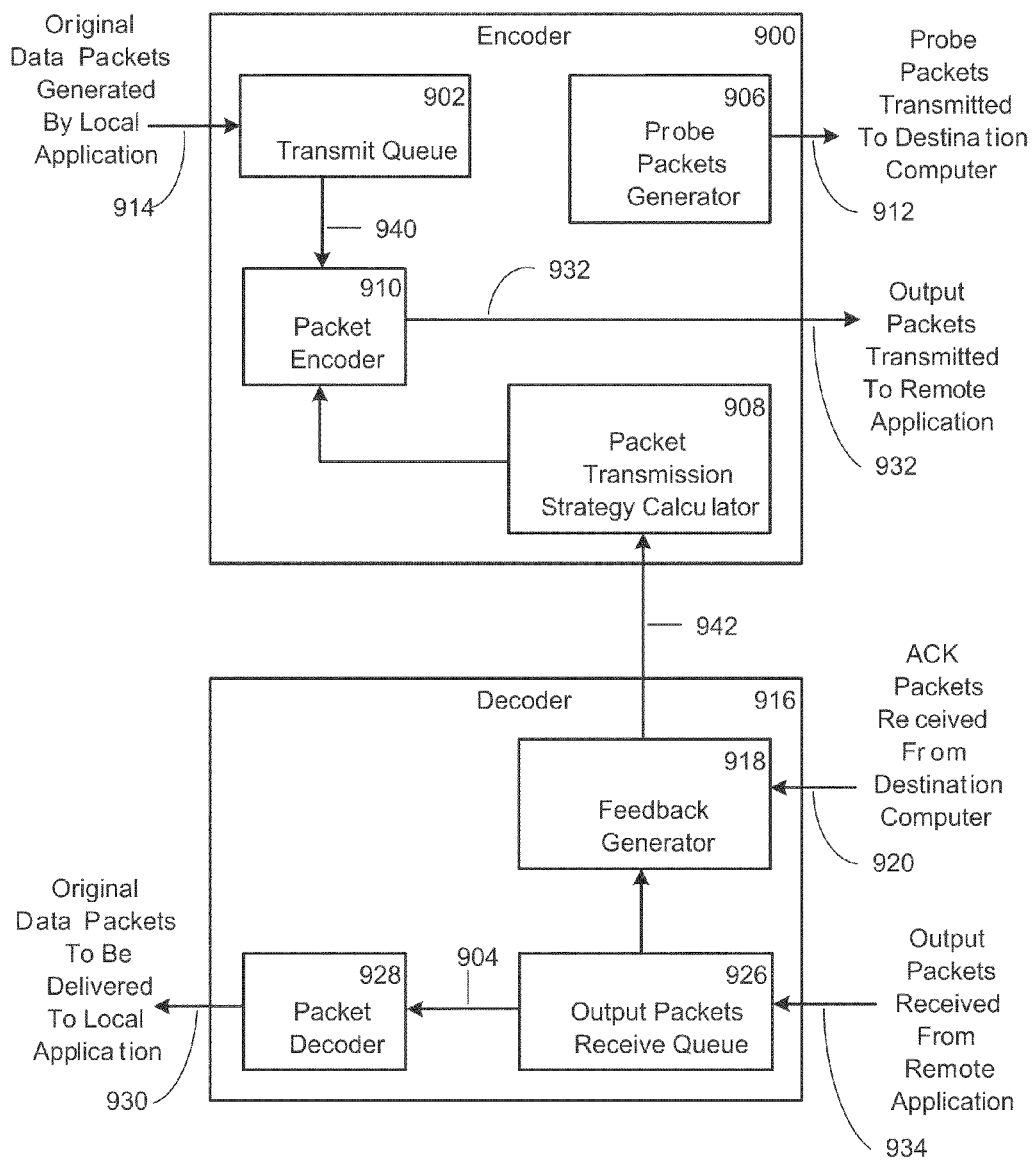
FIG. 9 illustrates an example architecture incorporating aspects of the methods disclosed herein.

FIG. 9 illustrates an exemplary embodiment of an encoder/decoder architecture. As shown in FIG. 9, original data packets generated by a local application 914 (which are destined for a remote application) are input to an encoder 900. Each input original packet 914 is temporarily stored in a transmit queue 902. Upon each transmission opportunity, a packet transmission strategy calculator 908 uses feedback 942 it receives from a decoder 916 to compute a variety of parameters representing the current state of the network. In one embodiment, these network state parameters may comprise the network's currently available bandwidth, current packet loss rate, current packet transmission delay and current router queue size. The packet transmission calculator 908 may use these network state parameters to dynamically compute the packet transmission flow control strategy and packet encoding strategy for the transmission opportunity. The packet transmission strategy calculator 908 may also maintain a history of previous network states which can also be used in the computation of these strategies.

Referring again to FIG. 9, when a new communications session is established between the local application and the remote application, the network's currently available bandwidth may be measured. The network's currently available bandwidth may be measured by transmitting a sequence of specialized, low overhead probe packets 912 (it is noted that these are not data packets) over the network to the destination computer, where these probe packets were generated by a probe packets generator 906. It is noted that alternate embodiments are also possible wherein the network's currently available bandwidth may be measured or estimated using other known methods.

Once the packet encoding strategy has been calculated 908 for a given transmission opportunity, then based on this strategy the packet encoder 910 may read 940 one or more original packets from the transmit queue 902 and form an output packet 932 from the original packets, where the output packet is subsequently transmitted over the network to the remote application. Based on the calculated packet encoding strategy, the output packet 932 can be a single original packet or an FEC packet which is formed from a linear combination of a plurality of original packets.

Output packets that are received over the network from the remote application 934 may be input to the decoder 916. Each received output packet 934 may be temporarily stored in an output packets receive queue 926. The received output packets may then be read 904 from the output packets receive queue 926 in a first-in first-out manner and are input to a packet decoder 928. The packet decoder 928 may attempt to decode each received output packet and extract the one or more original packets included therein. Original packets which are successfully extracted 930 may subsequently be delivered to the local application.

When the destination computer successfully receives a particular output packet 932 that was transmitted over the network from the source computer, the destination computer may transmit an acknowledgement (ACK) packet 920 over the network back to the source computer. The ACK packet 920 may indicate that the particular output packet 932 was successfully received by the destination computer. The ACK packet 920 may also indicate that the particular output packet 932 is considered lost since a later output packet 932 was successfully received by the destination computer. The ACK packet 920 can also indicate if the particular output packet 932 was received out of order. ACK packets that are received over the network from the destination computer 920 are input to a feedback generator 918. The feedback generator 918 processes the ACK packets to routinely compute the round-trip time and a one-way packet transmission delay indicator at a prescribed interval, where this delay indicator specifies if the one-way packet transmission delay is increasing, decreasing or unchanged. The feedback generator 918 maintains a history of computed round-trip times and delay indicators, and also routinely computes (at the prescribed interval) a median round-trip time over a prescribed congestion window. The feedback generator 918 provides the ACK packets, the computed round-trip times, the computed delay indicators, and the computed median round-trip times to the packet transmission strategy calculator 908 as part of the aforementioned feedback 942.

The encoding strategy function may employ an adaptive FEC method wherein for each transmission opportunity the source computer may dynamically determine for each output packet to be transmitted over the network, whether the output packet will be an FEC packet or a single original packet.

If it is decided that the output packet will be an FEC packet, the packet encoding function may dynamically determine which FEC packet to transmit. These decisions are based on minimizing the expected time until each original data packet becomes useful to the remote application on the destination computer, and take into consideration the current state of the network and the current transmission status of each original packet generated by the local application.

The adaptive FEC function may reduce congestion in the transmit queue 902 of the encoder 900. Referring again to FIG. 9, upon each transmission opportunity the source computer's packet transmission strategy calculator 908 groups the sequences of original packets generated by the local application 914 into the following four different sets, where the grouping is based on the current transmission status of each original packet 914. The first set comprises original packets 914 which have already been formed into output packets 932 by the packet encoder 910 and transmitted over the network to the destination computer at various transmission opportunities, and are definitively known to have been successfully received by the destination computer. The second set comprises original packets 914 which have already been formed into output packets 932 by the packet encoder 910 and transmitted over the network to the destination computer at various transmission opportunities, and are definitively known to have not been successfully received by the destination computer due to having been lost or corrupted during their transmission over the network.

Referring again to FIG. 9, the third set comprises original packets 914 which have already been formed into output packets 932 by the packet encoder 910 and transmitted over the network to the destination computer at various transmission opportunities, but no definitive information is known regarding whether or not these original packets have been successfully received by the destination computer. Original packets 914 in this third set are assumed to still be "in flight." The fourth set comprises original packets 914 which have not yet been formed into output packets and transmitted over the network to the destination computer.

Upon each transmission opportunity the source computer's packet transmission strategy calculator 908 uses the information it has regarding the current state of the network and the current transmission status of each original packet generated by the local application 914 (i.e., which if any original packets are in the first, second, third and fourth sets described above) to dynamically decide how the next output packet to be transmitted over the network will be formed. This decision may be made as follows.

When there are no original packets in the second set, third set or fourth set at the current transmission opportunity (i.e., all of the original packets generated by the local application have been successfully received by the remote application), the strategy calculator 908 simply instructs the packet encoder 910 to form no output packet (i.e., nothing would be transmitted at the current transmission opportunity). In the unlikely event that there are one or more original packets in the second set at the current transmission opportunity, the strategy calculator 908 can instruct the packet encoder 910 to form the next output packet from one particular original packet in the second set (i.e., the output packet transmitted at the current transmission opportunity would comprise a retransmission of a particular original packet which was lost during its previous transmission over the network).

When there are no original packets in the third set, but there are one or more original packets in the fourth set at the current transmission opportunity, the source computer's packet transmission strategy calculator 908 instructs the packet encoder 910 to form the next output packet from the next original packet in the fourth set. Whenever there are no original packets in the fourth set, but there are one or more original packets in the third set at the current transmission opportunity, the source computer's packet transmission strategy calculator 908 instructs the packet encoder 910 to form the next output packet as an FEC packet. Whenever there are one or more original packets in both the third and fourth sets at the current transmission opportunity, the strategy calculator 908 computes a first sum of expected packet transmission delays for the original packets in the third and fourth sets over a prescribed number N of succeeding transmission opportunities based on the assumption that the next output packet is formed as an FEC packet. The strategy calculator 908 also computes a second sum of expected packet transmission delays for the original packets in the third and fourth sets over the prescribed number N of succeeding transmission opportunities based on the assumption that the next output packet is formed from the next original packet in the fourth set.

In one embodiment of the packet encoding strategy function, after the first and second sums have been computed, the strategy calculator 908 compares the first and second sums. Whenever the first sum is less than the second sum, the strategy calculator 908 instructs the packet encoder 910 to form the next output packet as an FEC packet. Whenever the first sum is equal to or great than the second sum, the strategy calculator 908 instructs the packet encoder 910 to form the next output packet from the next original packet in the fourth set.

In another embodiment, after the first and second sums have been computed, the strategy calculator 908 may compute a first probability of the first sum being smaller than a prescribed threshold. The strategy calculator 908 then computes a second probability of the second sum being smaller than the prescribed threshold. The strategy calculator 908 then compares the first and second probabilities. Whenever the first probability is greater than the second probability, the strategy calculator 908 instructs the packet encoder 910 to form the next output packet as an FEC packet. Whenever the first probability is equal to or less than the second probability, the strategy calculator 908 instructs the packet encoder 910 to form the next output packet from the next original packet in the fourth set.

Although transmitting an output packet comprising an FEC packet at the current transmission opportunity can reduce the transmission delay for original packets in the third set, this could have an effect of increasing the transmission delay for original packets in the fourth set. On the other hand, if an output packet comprising the next original packet in the fourth set is transmitted at the current transmission opportunity, this could have an effect of increasing the transmission delay for original packets in the third set. The strategy calculator weighs these two effects against each other based on the current content of the third and fourth sets and determines the optimal type of output packet to transmit over the network at each transmission opportunity in order to minimize the expected transmission delays due to packet loss and congestion in the network. Although the aggressive ramp-up in the rate of transmission can result in the source computer transmitting output packets at a rate which overshoots the network's currently available bandwidth, and thus can result in an increase in the network's packet loss rate due to congestion in the network, the transmission of output packets comprising FEC packets can compensate for such packet loss. As the network's packet loss rate decreases due to a reduction of congestion in the network, the probability of the strategy calculator deciding that an output packet will be an FEC packet will generally also be reduced.

Figure 10:
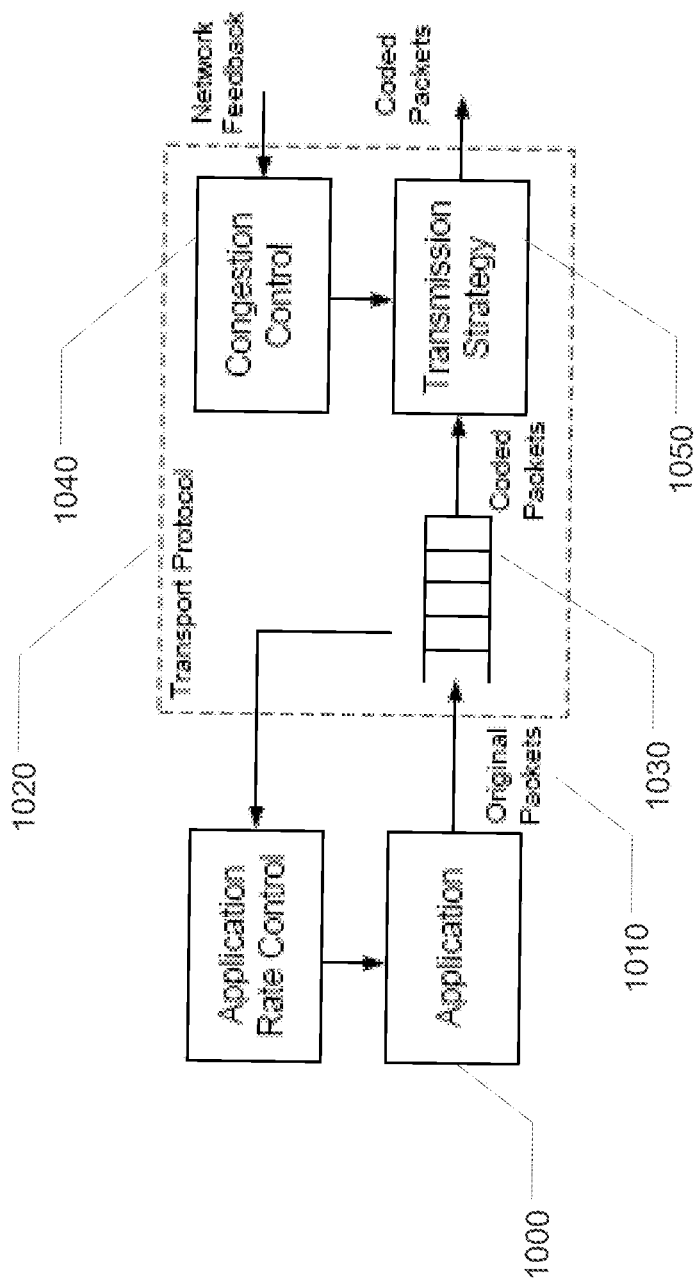
FIG. 10 illustrates an example architecture incorporating aspects of the methods disclosed herein.

FIG. 10 illustrates a block diagram of a typical network setup of interactive applications. The sender application 1000 produces original source packets 1010 to send to the receiver. These packets typically come in a burst and consist of data which the receiver will process in order. The packets are sent to the transport module 1020. The transport module typically has a buffer 1030 to temporarily hold the packets. The packets leave the buffer only when they have been acknowledged by the receiver. If the sending buffer is full, the sending application receives feedback of this event from the transport module and reduces its sending rate. For example, for an application that is sending audio/video, it can re-compress the audio/video at a lower bit rate. For game applications, it can reduce the game status update interval to reduce the sending rate. However, once the packets enter the transport module's buffer, they must be delivered losslessly to the receiver.

The transport function may consist of two components. One component is the congestion control component 1040 which estimates the available bandwidth in the communications channel, determines the current sending rate, and backs off (reduces sending rate) when congestion is detected. It tries to find a fair share of the bandwidth for the sending application while trying to minimize self congestion induced loss and queuing delay. The hybrid FEC-ARQ protocol disclosed herein can operate with many existing congestion control modules, e.g., TFRC rate control. The second component may be a transmission strategy component 1050 that determines which type of packet to send at each transmission opportunity.

Figure 11:
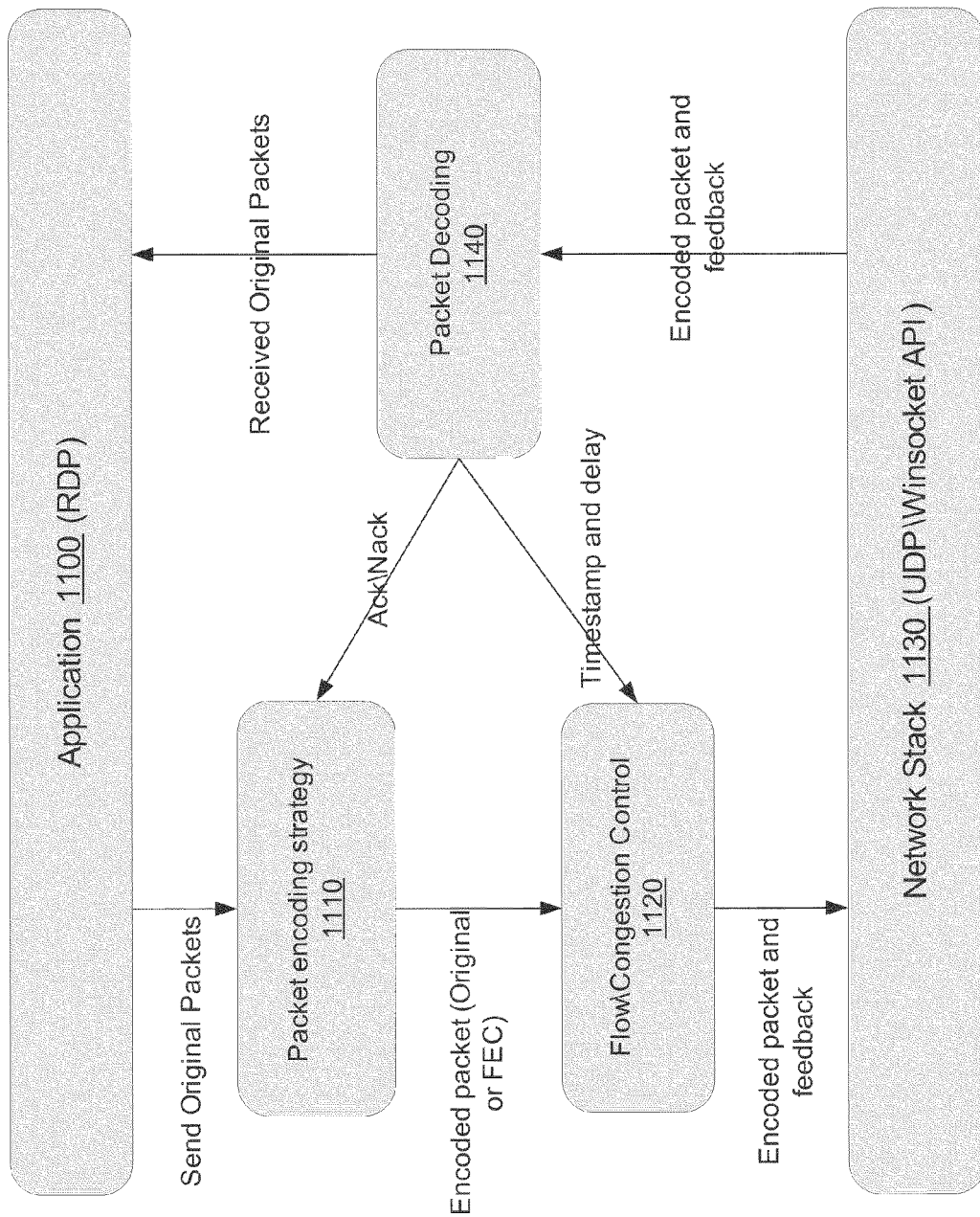
FIG. 11 illustrates an example architecture incorporating aspects of the methods disclosed herein.

FIG. 11 illustrates an example of a functional block diagram illustrating some of the methods disclosed herein. The sender application 1100 produces original source packets to send to the receiver. A packet encoding strategy 1110 may be provided that determines which type of packet to send at each transmission opportunity. A congestion control component 1120 may be provided that estimates the available bandwidth in the communications channel, determines the current sending rate, and backs off (reduces sending rate) when congestion is detected. The encoded packet may be sent to the network stack 1130 for sending to the client, where the packets may be decoded using a packet decoding function 1140 and provided to the corresponding application 1100 at the client.

Since delay is an important factor in determining the perceived user performance of interactive applications, the transport module may reduce the expected delay incurred by each packet while ensuring reliable in-order delivery. The delay incurred by the packets has several components—e.g., waiting time in the sender's queue, propagation delay, network queuing delay, retransmission delay, and decoding delay if a coding scheme is used. The requirement of in-order delivery can also cause additional delay as a packet may need to wait for prior missing packets to be delivered or decoded.

For the following discussion, original packets may be defined as the data packets which the application wishes to send from the sender to the receiver. For a stream with an in-order reliable delivery requirement, original packet i is defined to be sequentially decodable (i.e. usable) if and only if it and all prior packets j≤i are delivered or decoded. Let sequential decodability delay (SDD) refer to the time span between when a packet enters the sender queue (from the application) to the time it becomes sequentially decodable. This is the delay that is important for interactive applications. Let coded packets refer to the packets that actually enter the network. These packets can be original, FEC packets, or resent packets. Let transmission delay be the delay sending these coded packets from the sender to the receiver. This delay consists of the network propagation delay and queuing delay. The SDD on the original packets is a function of transmission delay incurred by the coded packets as well as loss rate suffered by the coded packets and the coding strategy being used.

The transmission strategy can send one of three types of packets: original packet, FEC packet, or resent packet. The FEC packets consist of linear combinations (over a Galois field) of existing unacknowledged (undecodable) packets in the sender queue. Let x[l] be the lth original source packet which is represented as a vector of bytes, each of which is an element in $GF(2^8)$. Then, if y[k] is the kth packet sent from the sender to the receiver, it can be written as $$y[k] = \sum_{l=b[k]}^{e[k]} f_{k,l} x[l] = f_k^* x,$$

where $f_{k,l}$ are coefficients from $GF(2^8)$. If an original packet is sent, then y[k]=x[b[k]], for some b[k] and e[k]=b[k]. Because of the in-order requirement, it can be shown that for FEC packets, without loss of optimality, b[k] can be assumed to be the index of the first undecoded original packet in the sender queue. The transmission strategy chooses from amongst the following three transmission policies:

Sending a new source packet without coding.
Sending an FEC packet of only the first certain number of undecoded packets.
Resending an already sent packet which has timed out or been negatively acknowledged.

At any given transmission opportunity, the cost used to decide amongst the various policies is used to minimize the expected SDD. The following terms, which are defined.

n is the current transmission opportunity.

B[n] is the index of the first unacknowledged packet in the sender queue prior to transmission n.

E[n] is the index of the last packet in the sender's queue.

D[n]≤E[n] is the index of the first packet which has not yet been sent.

τ[k] is the time when coded packet k leaves the sender.

Δ[k] is the transmission delay experienced by coded packet k (propagation delay plus queuing delay).

$\gamma_l$ is the time original packet l enters the sender queue.

The expected SDD for original packet l can be written as $$D_l = \Sigma_{\delta \in D} \delta \text{Prob}(SDD=\delta).$$

where D is the set of possible values for SDD given by τ[k]+Δ[k]−$\gamma_l$ over k.

The probability of achieving this SDD is $p_l[k] - p_l[k-1]$, where $p_l[k]$ is the probability that all original packets up to and including l are decodable (i.e., packet l is sequentially decodable) using transmissions up to and including transmission k. This gives $$D_l = \sum_{k=0}^{\infty} (p_l[k] - p_l[k-1])(\tau[k] + \Delta[k] - \gamma_l).$$

The SDD is affected by the transmission delay through the term Δ[k], the time spent in the sender queue by τ[k]−$\gamma_l$, and the network loss and coding strategy by $p_l[k]$.

It may be assumed that the congestion control module achieves a smooth transmission rate and queuing delay. Thus τ[k+1]−τ[k]=T (the time between successive transmission opportunities is relatively constant) and Δ[k]=Δ (transmission delay is stable and approaches the network propagation plus queuing delay). Then, rearranging terms above (1), we get $$D_l = (\tau[s_l] + \Delta - \gamma_l) = \sum_{k=s_l}^{\infty} (1 - p_l[k])T,$$

where $s_l$ is the first packet transmission opportunity that comes after packet l enters the queue, that is $s_l = \min\{j: \tau[j] \geq 1\}$. This expected delay can be viewed in terms of waiting times. With probability 1, packet l waits until the first transmission opportunity that comes after it enters the queue plus the network transmission delay. With probability $1-p_l[k]$ it waits an additional time of T for the next transmission opportunity. At a given transmission opportunity n for M original packets, l and τ[$s_l$] are the same for all transmission policies. These common terms can be removed to obtain the cost function to be optimized as $$C = \sum_{l=0}^{M-1} \sum_{k=\max(s_l,n)}^{\infty} (1 - p_l[k]).$$

To simplify further, the method may only consider source packets starting from l=B[n] (all other packets have already been decoded) and ending at E[n] which is the last packet entering the sender queue. The method may also consider other packets past E[n] that will enter the sender's queue, but this will be application-specific. For each packet n, the method may only consider certain terms in the summation over k. For packets which currently have non-zero probability of decidability ($p_l[n-1] \neq 0$), the method may only consider the first term in the summation, and for original packets which have $p_l[n-1]=0$, we the method may look at the first $L_l$ terms which is defined to be the expected time until $p_l$ becomes non-zero. This gives, $$C \approx \sum_{l=B[n]}^{D[n]-1} (1 - p_l[n]) + \sum_{l=D[n]}^{E[n]} \sum_{k=n}^{n+L_l-1} 1.$$

$L_l$ can also be estimated as the expected number of transmission opportunities needed to successfully deliver all packets prior to original packet l. $L_l$ can be computed using the current expected number of missing packets $Q_n$ and the current loss estimate $\epsilon$ as $L_l = (Q_n + 1 - D[n])/(1 - \epsilon)$. The expected number of missing packets can be computed from the probabilities $p_l$. If we remove common terms and simplify, we get the following cost functions for sending an FEC and an original packet respectively $$C_{FEC} = \sum_{l=B[n]}^{D[n]-1} (1 - p_l[n]) + \frac{(E[n] - D[n] + 1)(Q_n + 1)}{1 - \epsilon},$$

$$C_{ORIG} = \sum_{l=B[n]}^{D[n]} (1 - p_l[n]) + \frac{(E[n] - D[n])Q_n}{1 - \epsilon}.$$

$p_l[n]$ is the new probability of sequential decodability if that packet is sent and $Q_n$ is the new value for the expected number of missing packets up to the last packet sent—if an FEC packet is sent, the last packet sent stays at D[n] and if an original packet is sent, it increases to D[n]+1. Using (5), we compute the cost for each possible FEC packet (each value of e[k] up to D[n]−1, with b[k]=B[n]) and for an original packet (b[k]=e[k]=D[n]) and send the one with minimum cost.

The value for $\epsilon$ used by (5) is estimated using a sliding window of certain number of packets into the past. The loss for this window is computed $\epsilon_W$) and the overall loss rate is updated using $\epsilon \leftarrow \eta \epsilon + (1-\eta)\epsilon_W$ using some weight η.

When allocating the transmission rate amongst source and FEC packets, one method is to allocate some percentage of it to the needed source rate (accounting for loss) and make sure that the percentage of non-innovative packets (waste) does not take more than the remainder. The waste can be computed using a deterministic term (based upon feedback) and a probabilistic term for the in-flight coded packets (those which have not been acknowledged or timed out). At a given transmission opportunity n, let w be the number of packets that are known to the sender to have been useless by the receiver (from feedback), and let t be the total number of packets received (from feedback). We can compute the expected fraction of packets which are waste (more than the needed amount defined as FEC packets minus lost packets) as $$u = \frac{w + \sum_{k \in \mathcal{F}} p_{e[k]}[k-1]}{(t + |\mathcal{F}|) - \left(w + \sum_{k \in \mathcal{F}} p_{e[k]}[k-1]\right)}, \tag{6}$$

where $\mathcal{F}$ is the set of in-flight coded packets, and $|\mathcal{F}|$ is the number of such packets. The probability $p_{e[k]}[k-1]$ is the probability that we were already able to decode up to e[k] given transmissions up to k−1, and thus is the probability that the kth coded packet with ending position e[k] was useless.

For any given packet that is being considered for transmitting at n, the method can update the set $\mathcal{F}$, and calculate an updated value of u. The method may control the amount of waste u to below a certain threshold $U_{MAX}$. If sending an FEC packet causes u to be above this threshold, then the packet is not sent.

Figure 13:
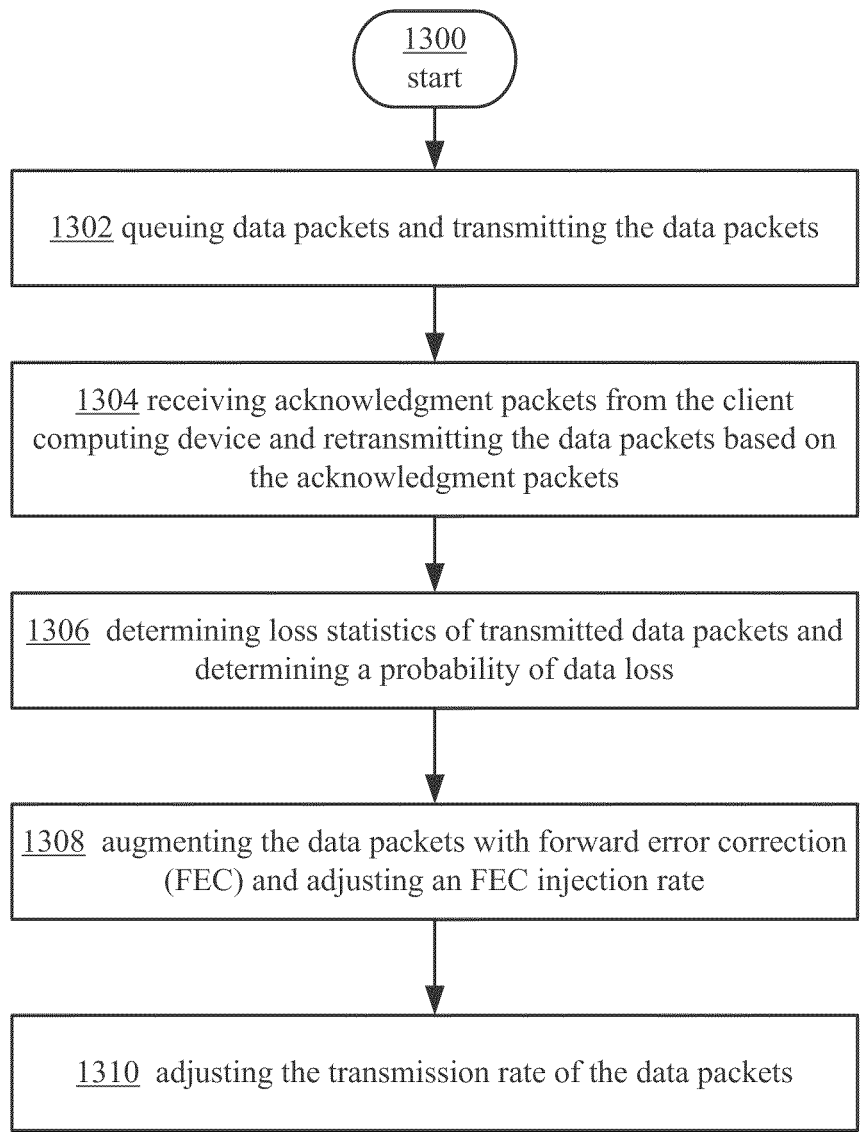
FIG. 13 illustrates an example of an operational procedure for processing graphics data for transmission to a client computer.

FIG. 13 depicts an exemplary operational procedure for transmitting remote presentation data from a computing device to a client computing device using a datagram based transport protocol including operations 1300, 1302, 1304, 1306, 1308, and 1310. In one embodiment, the datagram based transport protocol may be UDP. Referring to FIG. 13, operation 1300 begins the operational procedure and operation 1302 illustrates queuing data packets and transmitting the data packets in queued order. Operation 1304 illustrates receiving acknowledgment packets from the client computing device and retransmitting the data packets based on the acknowledgment packets. Operation 1306 illustrates determining loss statistics of transmitted data packets based on the acknowledgment packets and determining a probability of data loss based on the loss statistics. Operation 1308 illustrates augmenting the data packets with forward error correction (FEC) and adjusting an FEC injection rate based on the probability of data loss. Operation 1310 illustrates adjusting the transmission rate of the data packets based upon a congestion level determined as a function of a packet queuing delay, a packet loss rate, and a one-way delay (OWD) trend.

In an embodiment, the packet queuing delay, packet loss rate, and OWD trend may be estimated based on said acknowledgment packets. The above operations may further comprise inputting a sequence of data packets generated by an application into a transmit queue, and forming a sequence of output packets from the data packets in the transmit queue, wherein each output packet comprises either a FEC packet or a single data packet based on a decision which is dynamically determined at each transmission opportunity. The FEC packet may comprise a linear combination of data packets in the transmit queue, the linear combination determined over a Galois field.

The above operations may further comprise transmitting the sequence of output packets to the client computer and increasing the rate of transmission until congestion is detected. In one embodiment, the linear combination may comprise a predetermined sequence of unacknowledged data packets in the transmit queue. In another embodiment, the decision may use a cost function for minimizing an expected average sequential decodability delay over a number of data packets, the expected sequential decodability delay computed using a probability of sequential decodability. The congestion may be detected based upon the packet queuing delay, the packet loss rate, and the OWD trend, wherein the packet queuing delay, packet loss rate, and OWD trend is determined based on acknowledgement packets received from the client computer. The operations may further include the step of reducing the rate of transmission until the congestion is no longer detected.

In an embodiment, the packet queuing delay and OWD trend may be estimated based on a round-trip time (RTT) and a OWD. The packet loss rate may be estimated by computing a number of packets lost during a sliding window to compute an estimate of the current loss rate, and smoothing the estimated current loss rate using an exponential weighted moving average of the current loss rate to obtain an estimate of the probability of loss rate, wherein packets are declared to be lost when no acknowledgement is received within a retransmission time-out (RTO) that is computed using RTT and the variance in RTT (RTTVAR).

The congestion level may further be classified into one of three zones, the three zones characterized by: (1) the OWD is not increasing and the average packet queuing delay is less than a predetermined threshold, (2) OWD is not increasing, no packet is lost, and the average queuing delay is greater than the predetermined threshold but less than an upper threshold, and (3) OWD is increasing, the average queuing delay is greater than the upper threshold or packet loss is accompanied by an increase in an average queuing delay. The transmission rate may be increased when the congestion level is in zone 1, the transmission rate is reduced when the congestion level is in zone 2 or zone 3, and the transmission rate is reduced at a greater rate in zone 3 than in zone 2.

In an embodiment, the average packet queuing delay may be determined using a relative OWD which is a difference between an actual OWD and a minimum OWD measured over a predetermined number of OWD values and the OWD is a difference between a packet received time using a receiver clock and a sent time using a sender clock.

Figure 14:
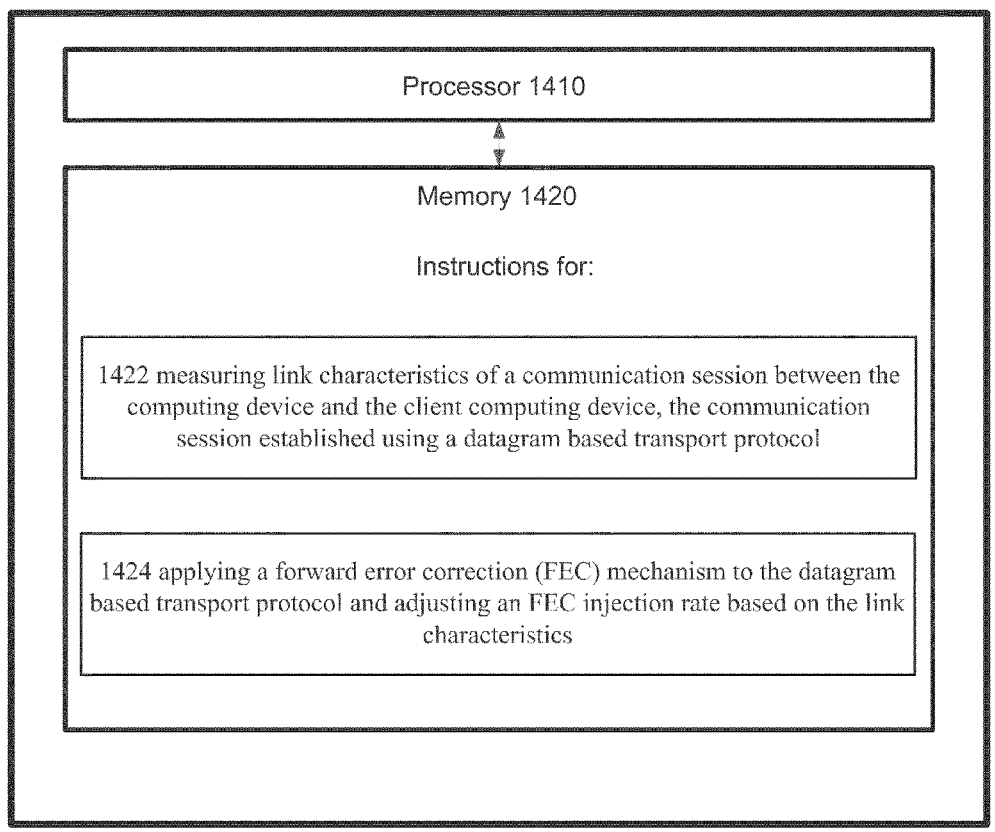
FIG. 14 illustrates an example system for processing graphics data for transmission to a client computer.

FIG. 14 depicts an exemplary system for transmitting remote presentation data from a computing device to a client computing device using a datagram based transport protocol as described above. Referring to FIG. 14, system 1400 comprises a processor 1410 and memory 1420. Memory 1420 further comprises computer instructions configured to transmit remote presentation data to a client computer. Block 1422 illustrates measuring link characteristics of a communication session between the computing device and the client computing device, the communication session established using a datagram based transport protocol. Block 1424 illustrates applying a forward error correction (FEC) mechanism to the datagram based transport protocol and adjusting an FEC injection rate based on the link characteristics and a predetermined maximum number of redundant packets.

Figure 15:
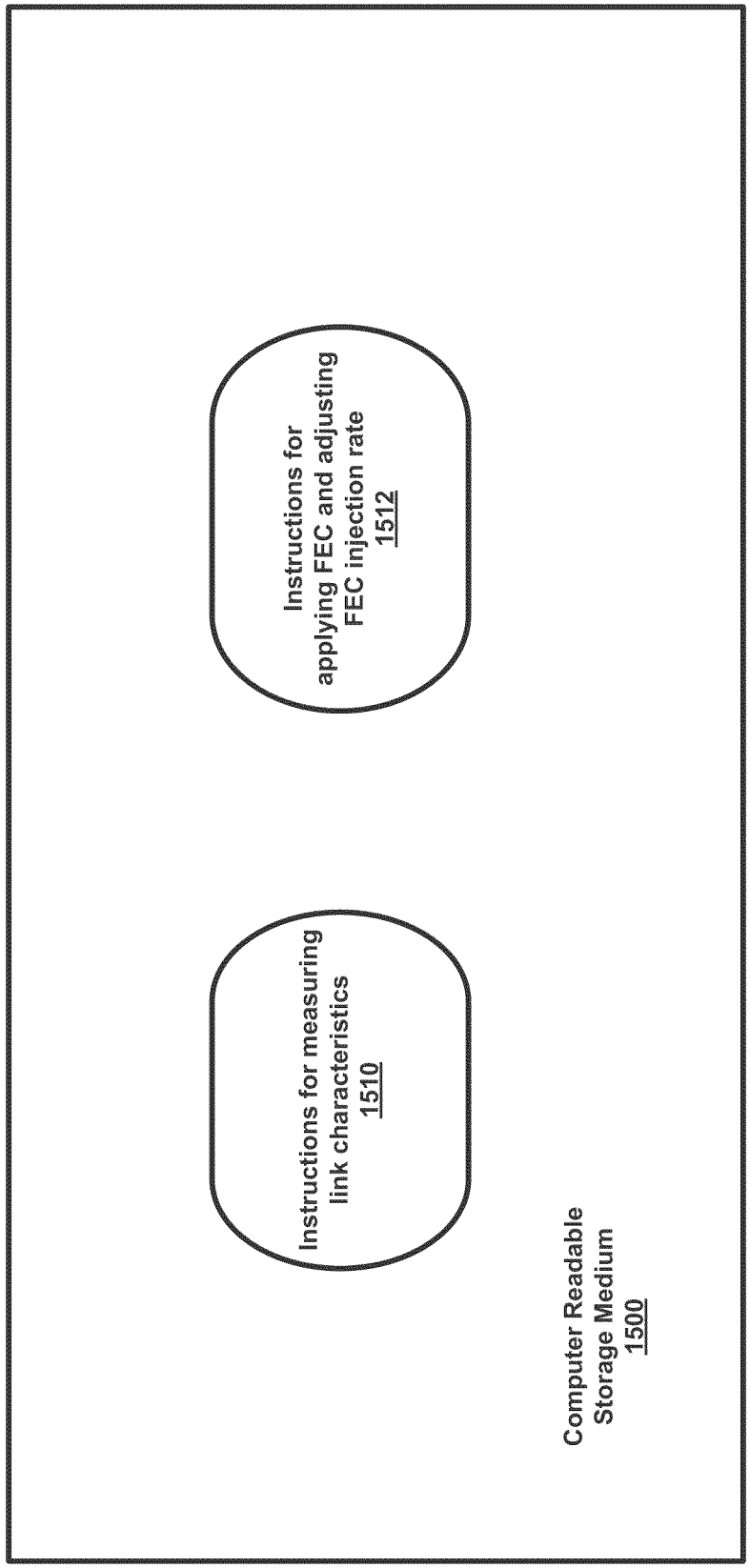
FIG. 15 illustrates a computer readable medium bearing computer executable instructions discussed with respect to FIGS. 1-14.

Any of the above mentioned aspects can be implemented in methods, systems, computer readable media, or any type of manufacture. For example, per FIG. 15, a computer readable medium can store thereon computer executable instructions for transmitting remote presentation data from a computing device to a client computing device using a datagram based transport protocol. Such media can comprise a first subset of instructions for measuring link characteristics of a communication session between the computing device and the client computing device, the communication session established using a datagram based transport protocol 1510; and a second subset of instructions for applying a forward error correction (FEC) mechanism to the datagram based transport protocol and adjusting an FEC injection rate based on the link characteristics 1512. It will be appreciated by those skilled in the art that additional sets of instructions can be used to capture the various other aspects disclosed herein, and that the three presently disclosed subsets of instructions can vary in detail per the present disclosure.

The foregoing detailed description has set forth various embodiments of the systems and/or processes via examples and/or operational diagrams. Insofar as such block diagrams, and/or examples contain one or more functions and/or operations, it will be understood by those within the art that each function and/or operation within such block diagrams, or examples can be implemented, individually and/or collectively, by a wide range of hardware, software, firmware, or virtually any combination thereof.

It should be understood that the various techniques described herein may be implemented in connection with hardware or software or, where appropriate, with a combination of both. Thus, the methods and apparatus of the disclosure, or certain aspects or portions thereof, may take the form of program code (i.e., instructions) embodied in tangible media, such as floppy diskettes, CD-ROMs, hard drives, or any other machine-readable storage medium wherein, when the program code is loaded into and executed by a machine, such as a computer, the machine becomes an apparatus for practicing the disclosure. In the case of program code execution on programmable computers, the computing device generally includes a processor, a storage medium readable by the processor (including volatile and non-volatile memory and/or storage elements), at least one input device, and at least one output device. One or more programs that may implement or utilize the processes described in connection with the disclosure, e.g., through the use of an application programming interface (API), reusable controls, or the like. Such programs are preferably implemented in a high level procedural or object oriented programming language to communicate with a computer system. However, the program(s) can be implemented in assembly or machine language, if desired. In any case, the language may be a compiled or interpreted language, and combined with hardware implementations.

While the invention has been particularly shown and described with reference to a preferred embodiment thereof, it will be understood by those skilled in the art that various changes in form and detail may be made without departing from the scope of the present invention as set forth in the following claims. Furthermore, although elements of the invention may be described or claimed in the singular, the plural is contemplated unless limitation to the singular is explicitly stated.

What is claimed:

1. A method for using a datagram based transport protocol to transmit remote presentation data from a computing device to a client computing device, the method comprising:
    queuing data packets and transmitting the data packets in queued order;
    receiving acknowledgment packets from the client computing device and retransmitting the data packets based on the acknowledgment packets;
    determining loss statistics of transmitted data packets based on the acknowledgment packets and determining a probability of data loss based on the loss statistics;
    augmenting the data packets with forward error correction (FEC) and adjusting an FEC injection rate based on the probability of data loss; and
    adjusting the transmission rate of the data packets based upon a congestion level determined as a function of a packet queuing delay, a packet loss rate, and a one-way delay (OWD) trend.

2. The method of claim 1, wherein the packet queuing delay, packet loss rate, and OWD trend is estimated based on said acknowledgment packets.

3. The method of claim 2, wherein the queued data packets are generated by a remote presentation application, further comprising:
    forming a sequence of output packets from the queued data packets, wherein each output packet comprises either a FEC packet or a single data packet based on a decision which is dynamically determined at each transmission opportunity.

4. The method of claim 3, wherein the FEC packet comprises a linear combination of queued data packets, the linear combination determined over a Galois field.

5. The method of claim 4, wherein the linear combination comprises a predetermined sequence of unacknowledged queued data packets.

6. The method of claim 3, further comprising transmitting the sequence of output packets to the client computer and increasing the rate of transmission until congestion is detected.

7. The method of claim 6, wherein said congestion is detected based upon the packet queuing delay, the packet loss rate, and the OWD trend, and wherein the packet queuing delay, packet loss rate, and OWD trend are determined based on the acknowledgement packets; further comprising:
    when said congestion is detected, reducing said rate of transmission until said congestion is no longer detected.

8. The method of claim 3, wherein the decision uses a cost function for minimizing an expected average sequential decodability delay over a number of data packets, the expected sequential decodability delay computed using a probability of sequential decodability.

9. The method of claim 1, wherein the datagram based transport protocol is UDP.

10. The method of claim 1, wherein said packet queuing delay and said OWD trend are estimated based on a round-trip time (RTT) and a OWD, and said packet loss rate is estimated by:
    computing a number of packets lost during a sliding window to compute an estimate of the current loss rate; and
    smoothing the estimated current loss rate using an exponential weighted moving average of the current loss rate to obtain an estimate of the probability of loss rate, wherein packets are declared to be lost when no acknowledgement is received within a retransmission time-out (RTO) that is computed using RTT and the variance in RTT (RTTVAR).

11. The method of claim 1, wherein said congestion level is classified into one of three zones, wherein the three zones are characterized by: (1) OWD is not increasing and the average packet queuing delay is less than a predetermined threshold, (2) OWD is not increasing, no packet is lost, and the average queuing delay is greater than the predetermined threshold but less than an upper threshold, and (3) OWD is increasing, the average queuing delay is greater than the upper threshold or packet loss is accompanied by an increase in an average queuing delay; and
    wherein the transmission rate is increased when the congestion level is in zone 1, the transmission rate is reduced when the congestion level is in zone 2 or zone 3, and the transmission rate is reduced at a greater rate in zone 3 than in zone 2.

12. The method of claim 1, wherein the average packet queuing delay is determined using a relative OWD which is a difference between an actual OWD and a minimum OWD measured over a predetermined number of OWD values and the OWD is a difference between a packet received time using a receiver clock and a sent time using a sender clock.

13. A system configured to transmit remote presentation data to a client computer, comprising:
    at least one processor; and
    at least one memory communicatively coupled to said at least one processor when the system is operational, the memory having stored therein computer-executable instructions that, upon execution by the processor, cause:
    measuring link characteristics of a communication session between the computing device and the client computing device, the communication session established using a datagram based transport protocol;

applying a forward error correction (FEC) mechanism to the datagram based transport protocol and adjusting an FEC injection rate based on the link characteristics and a predetermined maximum number of redundant packets; and adjusting a data transmission rate of the data packets based upon a congestion level.

14. The system of claim 13, wherein the link characteristics comprise available bandwidth, packet queuing delay and packet loss rate.

15. The system of claim 14, further comprising determining a probability of data loss, packet queuing delay, and OWD trend based on receiver and network feedback, wherein said adjusting the FEC injection rate is based on the probability of data loss.

16. The system of claim 15, further comprising applying congestion control using the packet queuing delay, OWD trend, and packet loss rate.

17. The system of claim 16, further comprising adjusting the data transmission rate based on detecting non-congestion.

18. A computer readable storage device storing thereon computer executable instructions for receiving remote presentation data on a client computer, said instructions for:

measuring link characteristics of a communication session between the computing device and the client computing device, the communication session established using a datagram based transport protocol; and applying a forward error correction (FEC) mechanism to the datagram based transport protocol and adjusting an FEC injection rate based on the link characteristics; and adjusting a data transmission rate of the data packets based upon a congestion level.

19. The computer readable storage device of claim 18, wherein the link characteristics comprise available bandwidth, packet delay and packet loss rate, further comprising determining a probability of data loss based on the available bandwidth and packet delay, wherein said adjusting the FEC injection rate is based on the probability of data loss.

20. The computer readable storage device of claim 18, further comprising:

applying congestion control based on said packet queuing delay, OWD trend, and packet loss rate; and adjusting the data transmission rate based on a detected non-congestion.

* * * * *